(12) United States Patent
Hanano

(10) Patent No.: US 7,234,837 B2
(45) Date of Patent: Jun. 26, 2007

(54) LIGHT EMITTING DEVICE, LIGHT EMITTING APPARATUS, AND IMAGE PROJECTION APPARATUS

(75) Inventor: Kazunari Hanano, Hachioji (JP)

(73) Assignee: Olympus Corporation, Tokyo (JP)

( * ) Notice: Subject to any disclaimer, the term of this patent is extended or adjusted under 35 U.S.C. 154(b) by 167 days.

(21) Appl. No.: 11/116,855

(22) Filed: Apr. 28, 2005

(65) Prior Publication Data

US 2005/0286252 A1 Dec. 29, 2005

(30) Foreign Application Priority Data

Jun. 25, 2004 (JP) ............................. 2004-188018
Dec. 21, 2004 (JP) ............................. 2004-369516

(51) Int. Cl.
*F21V 5/00* (2006.01)

(52) U.S. Cl. ...................... 362/246; 362/238; 362/240; 362/249; 362/256; 362/311; 362/331; 353/94

(58) Field of Classification Search ........ 362/237–238, 362/240, 244, 246, 249, 255–256, 311, 326, 362/331, 335–336, 800; 353/94
See application file for complete search history.

(56) References Cited

U.S. PATENT DOCUMENTS 4,698,730 A * 10/1987 Sakai et al. .................. 362/311

4,767,172 A     8/1988 Nichols et al.
5,440,468 A * 8/1995 Savage, Jr. .................. 362/655
5,939,996 A * 8/1999 Kniveton et al. ........ 340/815.4

FOREIGN PATENT DOCUMENTS

| JP | 04-138438 | 5/1992 |
|---|---|---|
| JP | 3269349 | 1/2002 |
| JP | 2004-102132 | 4/2004 |

* cited by examiner

*Primary Examiner*—Sandra O'Shea
*Assistant Examiner*—Jason Moon Han
(74) *Attorney, Agent, or Firm*—Volpe & Koenig PC

(57) ABSTRACT

A light emitting device, which includes at least one light emitting element, has a light emission portion which emits diffused light, at least one optical element upon which a concave portion is formed in which the diffused light which has been emitted from the light emitting element is incident, and which converts the diffused light into approximately parallel light and emits the approximately parallel light thereof to the exterior, and a holder portion which has one side surface, another side surface, and at least one through hole which extends between the one and the other side surfaces, and which holds the light emitting element and the optical element, in which the optical element is inserted into the through hole from a side of the one side surface of the holder portion, and is fixed therein, and the light emitting element is inserted into the through hole to which the optical element is fixed from a side of the other side surface of the holder portion, and is fixed therein.

27 Claims, 19 Drawing Sheets

FIG. 8A
FIG. 8B
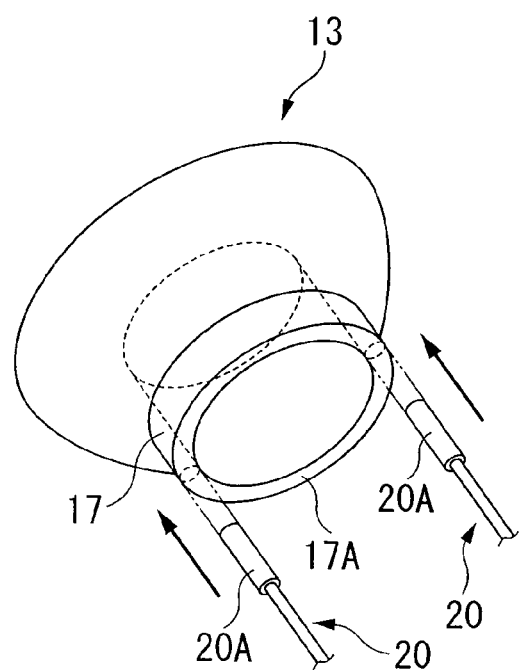
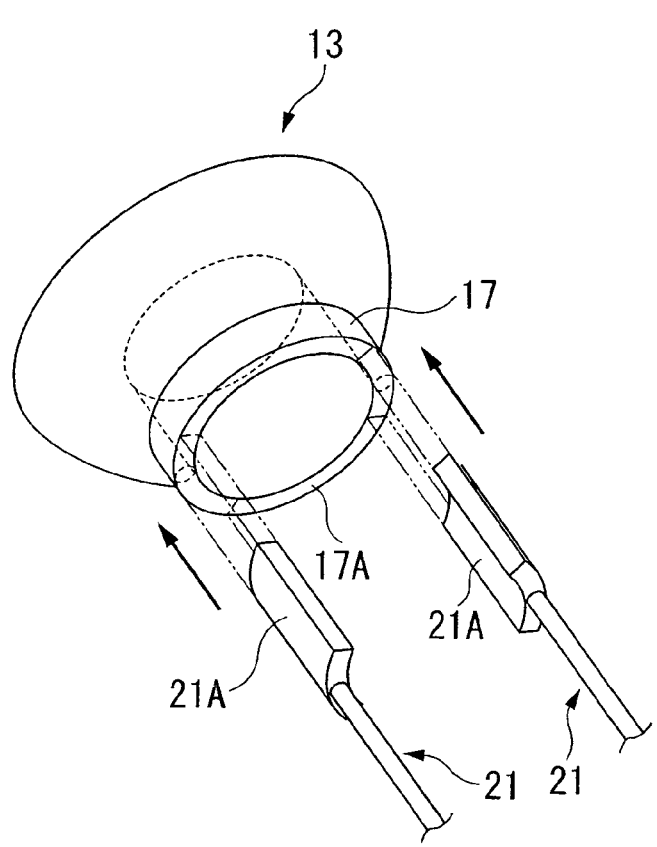

FLOW OF TIME

FLOW OF TIME

LIGHT EMITTING DEVICE, LIGHT EMITTING APPARATUS, AND IMAGE PROJECTION APPARATUS

BACKGROUND OF THE INVENTION

1. Field of the Invention

The present invention relates to a light emitting device, a light emitting apparatus, and an image projection apparatus.

Priority is claimed on Japanese Patent Application No. 2004-188018 filed Jun. 25, 2004 and Japanese Patent Application No. 2004-369516 filed Dec. 21, 2004, the content of which is incorporated herein by reference.

2. Description of Related Art

In order to implement even light at high luminance in a compact manner, in an invention which is related to an optical element in which a parabolic surface and a lens are combined, or to an optical element in which a reflective surface (a+lens) and a Fresnel lens are combined, there has been proposed a device which enhances the directivity of the light, and implements light of high luminance, by the operation of bending the light which is at a comparatively narrow angle among the light which has been radiated from the diffused light source with a lens or a Fresnel lens, and by the operation of reflecting the light which is at a comparatively wide angle among the light which has been radiated from the diffused light source with a parabolic surface, or a lens in combination with a plane surface, or the like (for example, see Patent Document 1: Japanese Unexamined Patent Application, First Publication No. 4-138438).

Furthermore, a device has been proposed which, by combining an optical element which is provided with a parabolic surface, a lens, and a plane surface portion with a diffused light source, in the same manner as described in Patent Document 1, light of high directivity is supplied in the forward direction through a plane surface by refracting the narrow angle light with a lens at the central portion, and by reflecting the wide angle light with a parabolic surface (for example, see Patent Document 2: U.S. Pat. No. 4,767, 172).

Furthermore, with regard to the structure of a light emitting apparatus, a device has been proposed in which, in order to support the lamp which is a so called arc discharge lamp upon a sleeve member of a reflective mirror, the reflective mirror is a parabolic surface mirror having a cylindrical portion along with a planar surface (for example, see Patent Document 3: Japanese Patent No. 3269349).

Yet further, in order to obtain a large amount of light from a diffused light source, a light emitting apparatus has been proposed in which a plurality of light emitting elements are arranged around a circle, and the light is emitted in pulses, and the light thereof is captured with two mutually opposing rods which rotate at a timing matched to the timing of the light emissions (for example, see Japanese Unexamined Patent Application, First Publication No. 2004-102132).

SUMMARY OF THE INVENTION

The present invention takes as its objective to provide a light emitting device and a light emitting apparatus which can implement even light at high luminance in a compact manner, and with which, moreover, the manufacturability is good; and also to provide an image projection apparatus with which, by employing the light emitting apparatus thereof, it is possible to obtain an image of high quality with good efficiency.

The present invention employs the following means to attain the objectives.

According to a first aspect of the present invention, there is proposed a light emitting device which includes at least one light emitting element which has a light emission portion which emits diffused light, at least one optical element upon which a concave portion is formed in which the diffused light which has been emitted from the light emitting element is incident, and which converts the diffused light into approximately parallel light and emits the approximately parallel light thereof to the exterior, and a holder portion which has one side surface, other side surface, and at least one through hole which is pierced between the one and the other side surfaces, and which holds the light emitting element and the optical element, in which the optical element is inserted into one of the through holes from a side of the one side surface of the holder portion, and is fixed therein, and the light emitting element is inserted into the through hole to which the optical element is fixed from a side of the other side surface of the holder portion, and is fixed therein.

Furthermore, in the light emitting device according to the present invention, the optical element may include a first convex portion which is formed so as to protrude so as to be able to be engaged in the through hole, the concave portion may be formed in the first convex portion in the opposite direction to the direction in which the first convex portion protrudes, and the light emitting element may include a second convex portion which can be engaged with the concave portion.

Furthermore, in the light emitting device according to the present invention, the through hole may be shaped as circular in cross section, and the first convex portion may be shaped as a circular cylinder.

Furthermore, in the light emitting device according to the present invention, a gap portion may be disposed at a portion of the through hole, in which, when the first convex portion is inserted therein, the contact with the first convex portion is avoided.

Furthermore, in the light emitting device according to the present invention, a portion of the optical element may be formed with a protruding portion which is formed to protrude, so as to be able to engage with the through hole, the concave portion may be formed upon the protruding portion in the opposite direction to the direction in which the protruding portion protrudes, a plurality of reception portions which open to one side surface may be provided upon the holder portion in the vicinity of the through hole, a plurality of holding portions may be provided upon the side surface of the protruding portion so as to stand up toward the direction in which the protruding portion protrudes, each of which can be inserted into one of the plurality of reception portions, and the light emitting element may include a second convex portion which can engage with the concave portion.

Furthermore, in the light emitting device according to the present invention, the optical element may include a first surface which can contact the light emitting element, and which extends approximately parallel to other side surface of the holder portion, the light emitting element may include a second surface which can contact the first surface, and which extends approximately parallel to the other side surface of the holder portion, and the contact position of the first surface and the second surface may be positioned as removed from the interior of the through hole.

Furthermore, in the light emitting device according to the present invention, the first surface and the second surface may be positioned at approximately the same position as the other side surface of the holder portion.

Furthermore, in the light emitting device according to the present invention, an engagement surface for a removal tool which is used when forming the optical element is provided in the first surface.

Furthermore, in the light emitting device according to the present invention, the optical element may include a reflection surface which is shaped as a paraboloid of revolution, which converts the diffused light which is incident from the concave portion into approximately parallel light, and the focal point position of the reflection surface may pass through the approximate center line of the through hole, and may be positioned upon an axis which is orthogonal to the first surface or the second surface.

Furthermore, in the light emitting device according to the present invention, the optical element may include a reflection surface which is shaped as a paraboloid of revolution, which converts the diffused light which is incident from the concave portion into approximately parallel light, and the focal point position of the reflection surface may pass through the approximate center line of the light emitting element, and may be positioned upon an axis which is orthogonal to the first surface or the second surface.

Furthermore, in the light emitting device according to the present invention, the approximately central position of the light emission portion may pass through the approximate center line of the through hole, and may be positioned upon an axis which is orthogonal to the first surface or the second surface.

Furthermore, in the light emitting device according to the present invention, the optical element and the holder portion may be fixed in the through hole with adhesive.

Furthermore, in the light emitting device according to the present invention, there may be further included a pressure member which presses the light emitting element towards the holder portion on the other side surface, and the light emitting element may be fixed to the holder portion by being pressed by the pressure member.

Furthermore, in the light emitting device according to the present invention, a heat radiation section which radiates away heat which is generated by the light emitting element is provided to the pressure member.

Furthermore, in the light emitting device according to the present invention, a plurality of through holes may be provided in the holder portion, and a plurality of optical elements and a plurality of light emitting elements may be provided.

Furthermore, in the light emitting device according to the present invention, the holder portion may be formed in a tubular shape, with the one side surface being defined upon its inner circumferential surface, and the other side surface being defined upon its outer circumferential surface.

Furthermore, in the light emitting device according to the present invention, at least one side surface of the holder portion may be formed as a cylindrical surface.

According to a second aspect of the present invention, there is proposed a light emitting apparatus, including a light emitting device as first described above, a pillar shaped light propagating unit which has an incident end surface which receives intake of a portion of the radiant light which has been emitted from the light emitting device, an emission end surface which emits the radiant light which has been taken in from the incident end surface, and a reflection surface which reflects at least a portion of the radiant light which has been taken in from the incident end surface, and leads the radiant light thereof to the emission end surface, a shift unit which shifts a portion of the pillar shaped light propagating unit with respect to the light emitting device, and a light emission control unit which controls light emission by the plurality of light emitting elements along with the shifting of the pillar shaped light propagating unit.

Furthermore, in the light emitting apparatus according to the present invention, only one of the pillar shaped light propagating unit may be provided, and, along with the shifting of the pillar shaped light propagating unit, the light emission control unit may make the plurality of light emitting elements facing to the one incident end surface emit in order.

Furthermore, in the light emitting apparatus according to the present invention, the plurality of through holes may be arranged on a circumference of which center is arranged on the central axis of the holder portion, and the plurality of rows of through holes are arranged along the central axial line direction.

Furthermore, in the light emitting apparatus according to the present invention, the through holes may be arranged so that the emission sides of the light emitting device can be arranged while being adjacent to zigzag configuration.

Furthermore, in the light emitting apparatus according to the present invention, the one incident end surface of the pillar shaped light propagating unit may be formed as a rectangle which is defined and surrounded by a first pair of sides which are approximately parallel to the central axis of the holder portion, and a second pair of sides which are each orthogonal to the first pair of sides, and the second pair of sides may be disposed at a distance of approximately contacting with an outer edge in the central axial direction according to the optical element of the light emitting device arranged to the row of each through hole.

Furthermore, in the light emitting apparatus according to the present invention, when the diameter of the emission end surface of the optical element is termed $\phi$, the number of the rows of through holes is termed n, and the distance between the second pair of sides is termed L, the relationship $\phi+(n-1)\times(\sqrt{3}/2)\times\phi \square L < n\times\phi$ may be satisfied.

Furthermore, in the light emitting apparatus according to the present invention, the pillar shaped light propagating unit may include one parallel rod upon which the incident end surface is provided, one prism which, along with being connected to the parallel rod, changes the direction of the light from the parallel rod with the reflection surface, and one tapered rod which, along with being separated from the prism, receives the light which has been bent by the prism, and directs the light to the emission end surface while reflecting the light thereof with the reflection surface.

According to a third aspect of the present invention, there is proposed an image projection apparatus which projects an image based upon image information which is inputted, having a light emitting apparatus of the type first described above, a spatial modulation unit which modulates light which is emitted from the emission end surface of the pillar shaped light propagating unit, based upon image information which has been inputted; and a projection optical unit which projects the light emitting light which has been modulated by the spatial modulation unit.

BRIEF DESCRIPTION OF THE DRAWINGS

FIG. 8A is an explanatory figure showing a portion of the process of manufacture of an optical element of the light emitting device according to the first preferred embodiment of the present invention.

FIG. 8B is an explanatory figure showing a portion of a process of manufacture of an optical element of the light emitting device according to the first preferred embodiment of the present invention.

DETAILED DESCRIPTION OF THE INVENTION

A first preferred embodiment of the present invention will now be explained with reference to FIGS. 1 through 18.

Figure 1:
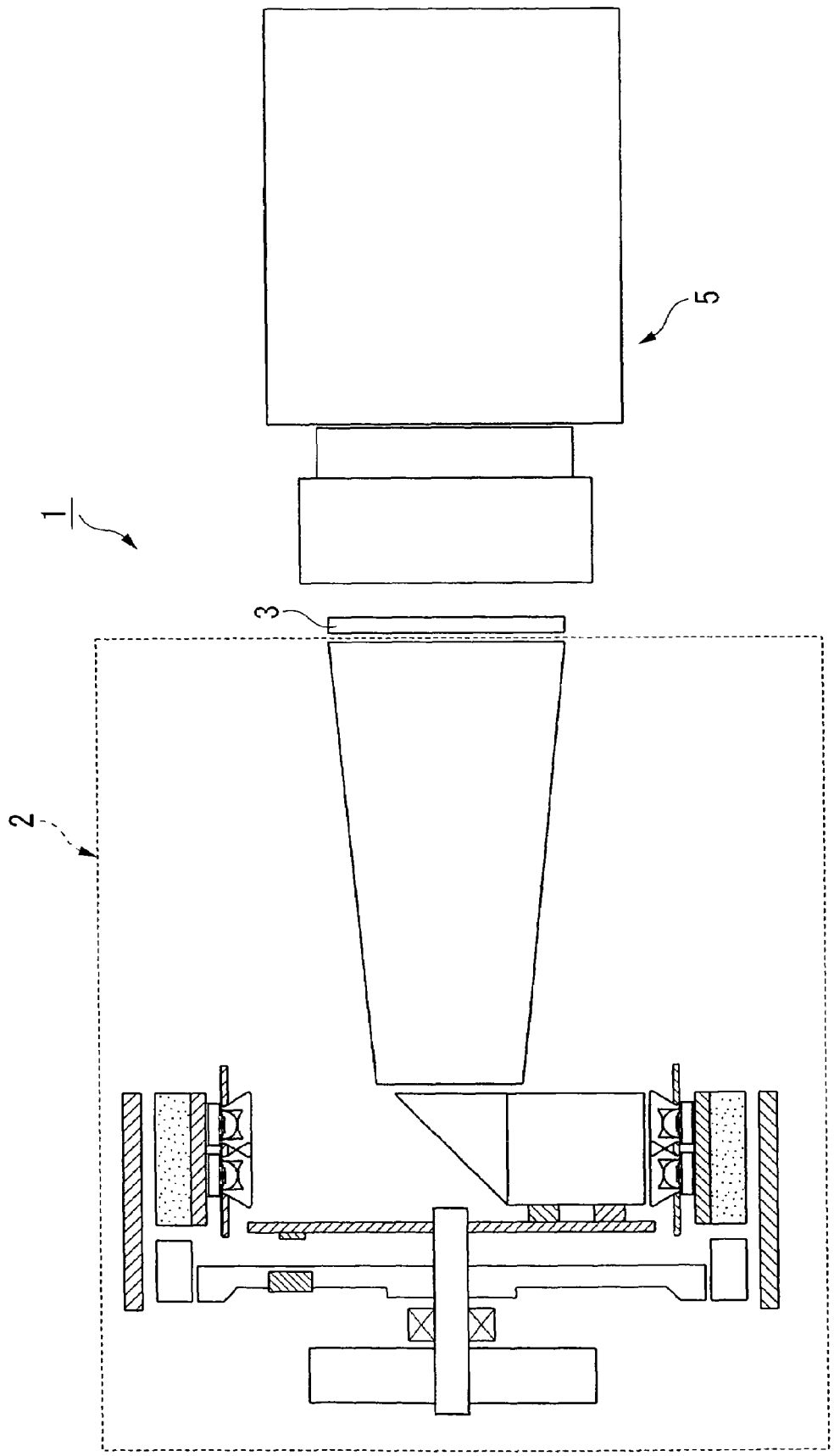
FIG. 1 is a schematic structural view showing essential portions of an image projection apparatus according to the first preferred embodiment of the present invention.

The image projection apparatus according to the preferred embodiment is an image projection apparatus which projects an image based upon image information which is inputted, and, as shown in FIG. 1, has a light emitting apparatus 2 which emits light, a LCD (liquid crystal diode) panel 3 (a spatial modulation unit) which modulates the light which is emitted from the light emitting apparatus 2 according to image information which is inputted, and a projection lens 5 (a projection optical unit) which projects the light which has been modulated by the LCD panel 3.

Figure 2:
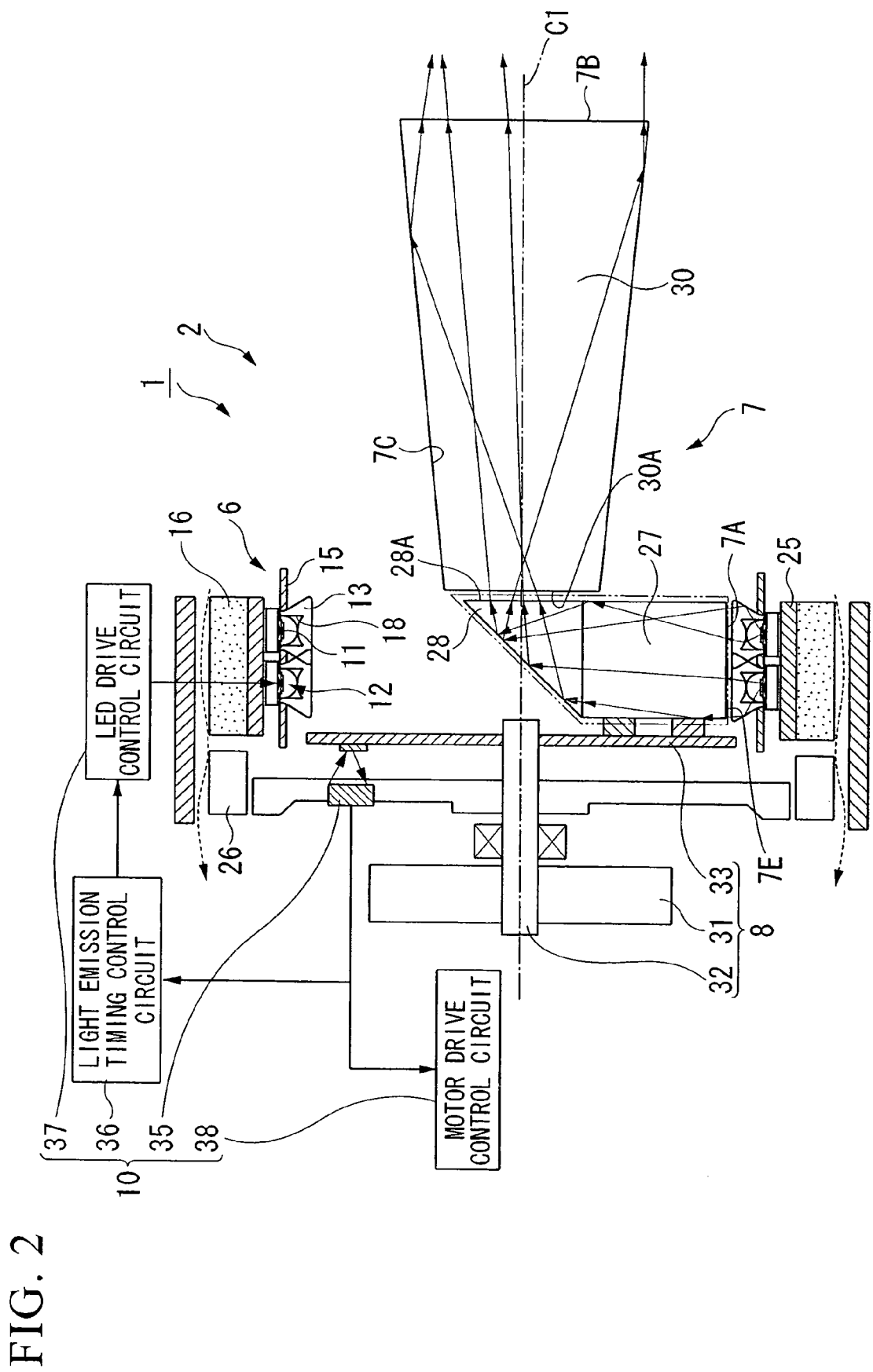
FIG. 2 is a structural view showing a light emitting apparatus according to the first preferred embodiment of the present invention.
Figure 3:
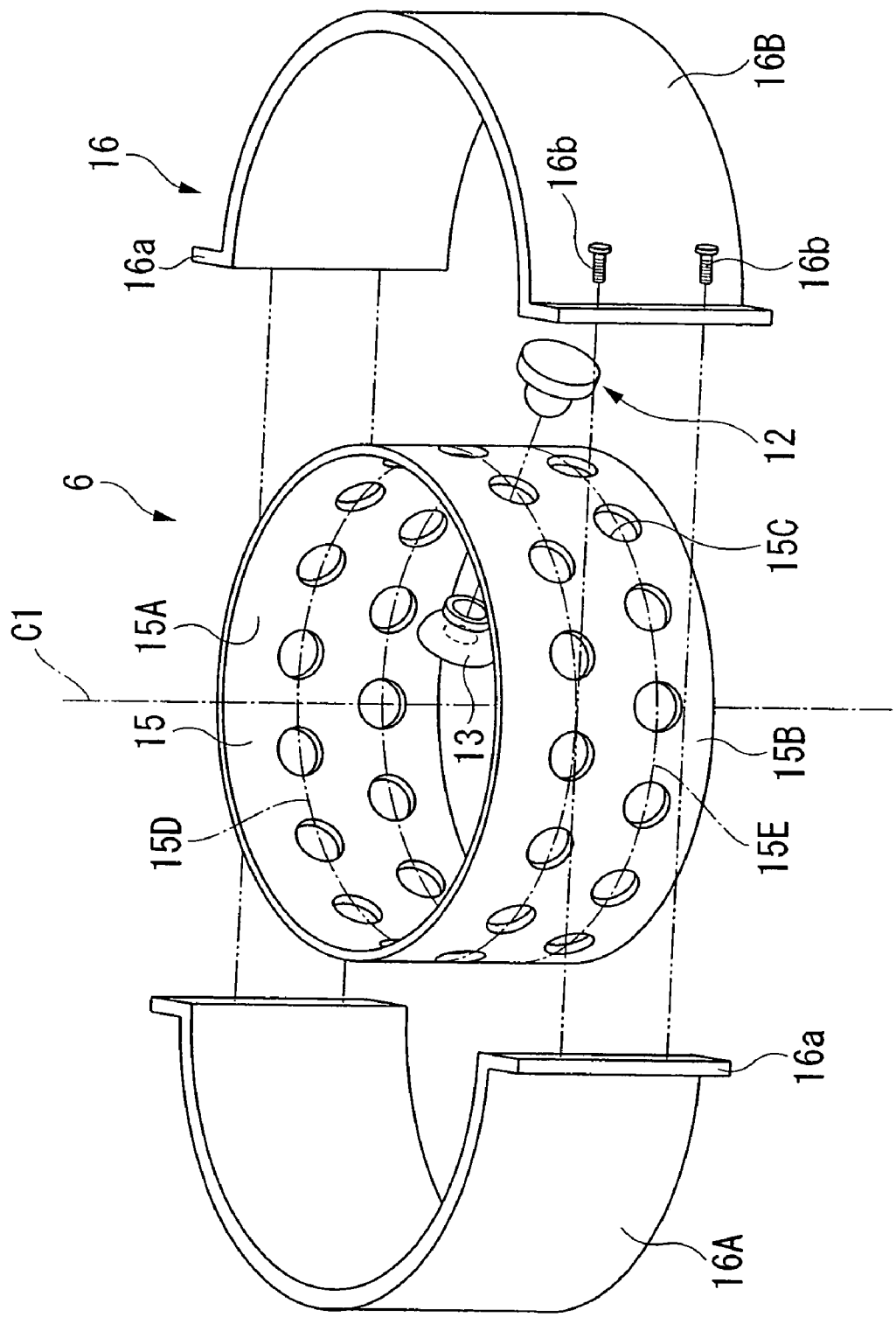
FIG. 3 is an exploded perspective view showing a light emitting device according to the first preferred embodiment of the present invention.

As shown in FIGS. 2 and 3, the light emitting apparatus 2 has a light emitting device 6 which emits radiant light as light, a pillar shaped light propagating unit 7 which has a light intake incident end surface 7A upon which a portion of the radiant light which is emitted from the light emitting device 6 is incident, a light emission end surface 7B which emits the radiant light which has been taken in through the incident end surface 7A, and a reflection surface 7C which reflects at least a part of the radiant light which has been taken in through the incident end surface 7A and guides the radiant light to the light emission end surface 7B, a shift unit 8 which shifts a portion of the pillar shaped light propagating unit 7 with respect to the light emitting device 6; and a light emission control unit 10 which, along with controlling the shifting of the pillar shaped light propagating unit 7, also controls the emission of light by the light emitting device 6.

As shown in FIG. 3, a light emitting device 6 has LEDs (light emitting element) 12 which have light emission portions 11 which emit diffused light, optical elements 13 upon which concave portions 18 are formed in which the diffused light which has been emitted from the LEDs 12 are incident, and which convert the diffused light into approximately parallel light and emit the approximately parallel light thereof to the exterior, a holder portion 15 which has one side surface 15A, other side surface 15B, and a through hole 15C which is pierced between the one and the other side surfaces 15A and 15B, and which holds the LEDs 12 and the optical elements 13, and a pressure member 16 in which the LEDs 12 are pressed to the other side surface 15B toward the holder portion 15. Furthermore, a plurality of through holes 15c are provided to the holder portion 15, and a plurality of LEDs 12 and a plurality of optical elements are provided.

As described above, the holder portion 15 is shaped as a cylinder, and the cylinder thereof has a central axial line C1, an inner cylindrical surface which consists of the inner side surface 15A, and an outer cylindrical surface which consists of the outer side surface 15B.

Each of the through holes 15C is circular in cross sectional shape, and, as shown in FIG. 3, the through holes 15C are arranged as a plurality of rows 15D and 15E of through holes, each of which extends in a circle around the circumference of the holder portion 15, around the central axial line C1 thereof as a center. The two rows 15D and 15E of through holes extend parallel to one another in the direction of the central axial line C1, and the two rows 15D and 15E of through holes are staggered with respect to one another, so that, when the optical elements 13 are fitted to the holder portion 15 by being inserted into the through holes 15C, the optical elements 13 are arranged alternatingly in the two rows 15D and 15E of through holes in a zigzag arrangement, thus coming as close to one another as possible and achieving the maximum possible density. Furthermore, as shown in FIG. 3, the optical elements 13 (only one of which is shown in the figure) are fixed into the through holes 15C by being inserted thereinto from the circumferentially inner side surface 15A of the holder portion 15 towards its outside, and then the LEDs 12 are fixed into the through holes 15C by being inserted thereinto from the circumferentially outer side surface 15B of the holder portion 15 towards its inside, passing within the optical elements 13 which have already been fixed into the through holes 15C, as will be described in more detail hereinafter.

Figure 4B:
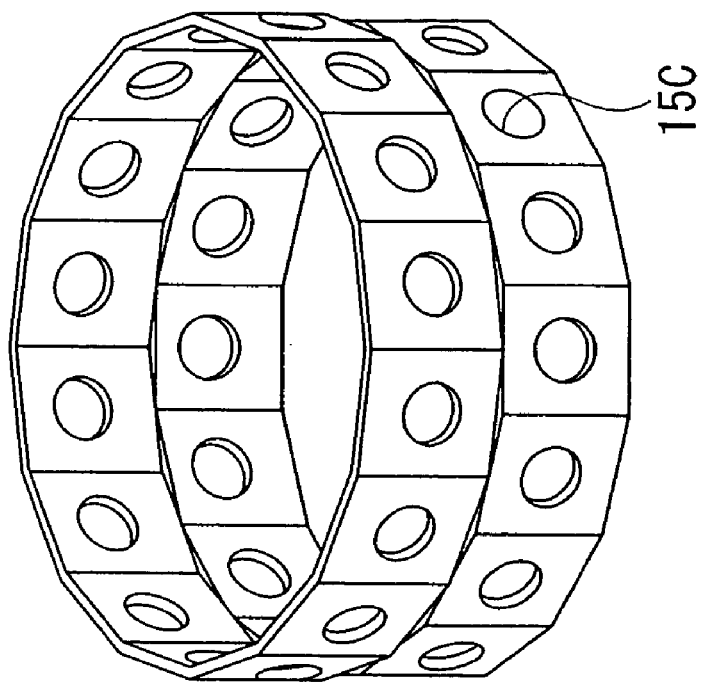
FIG. 4B is a perspective view showing another example of a holder portion of a light emitting device according to the first preferred embodiment of the present invention.
Figure 4A:
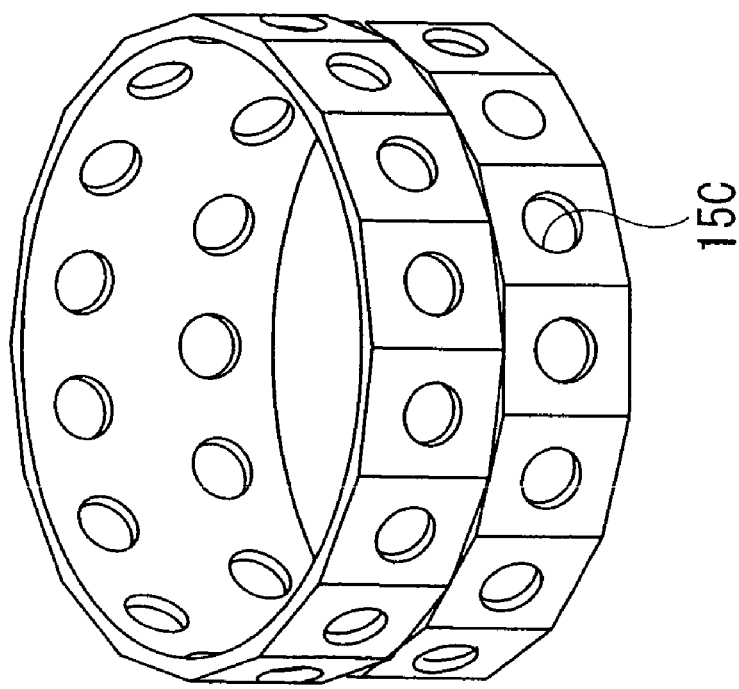
FIG. 4A is a perspective view showing another example of a holder portion of a light emitting device according to the first preferred embodiment of the present invention.

It should be understood that, as shown in FIG. 4A, in order for the LEDs 12 to be easily fixed therein, and in order to achieve a high fitting density of the LEDs 12, the portions of the circumferentially outer side surface 15B of the holder portion 15 in the vicinities of the through holes 15C may be formed as plane surfaces, so that the outer side surface 15B is generally formed as a multi-faceted polyhedron. Furthermore, in an analogous manner, as shown in FIG. 4B, in order for the optical elements 13 to be easily fixed therein, one side of the side surface may be formed as a multi-faceted polyhedron.

Each of the optical elements 13 is made as an integral element from, for example, PMMA (acryl), PC (polycarbonate), Zeonex made by Nippon Zeon (this is a trademark), or the like.

Figure 5:
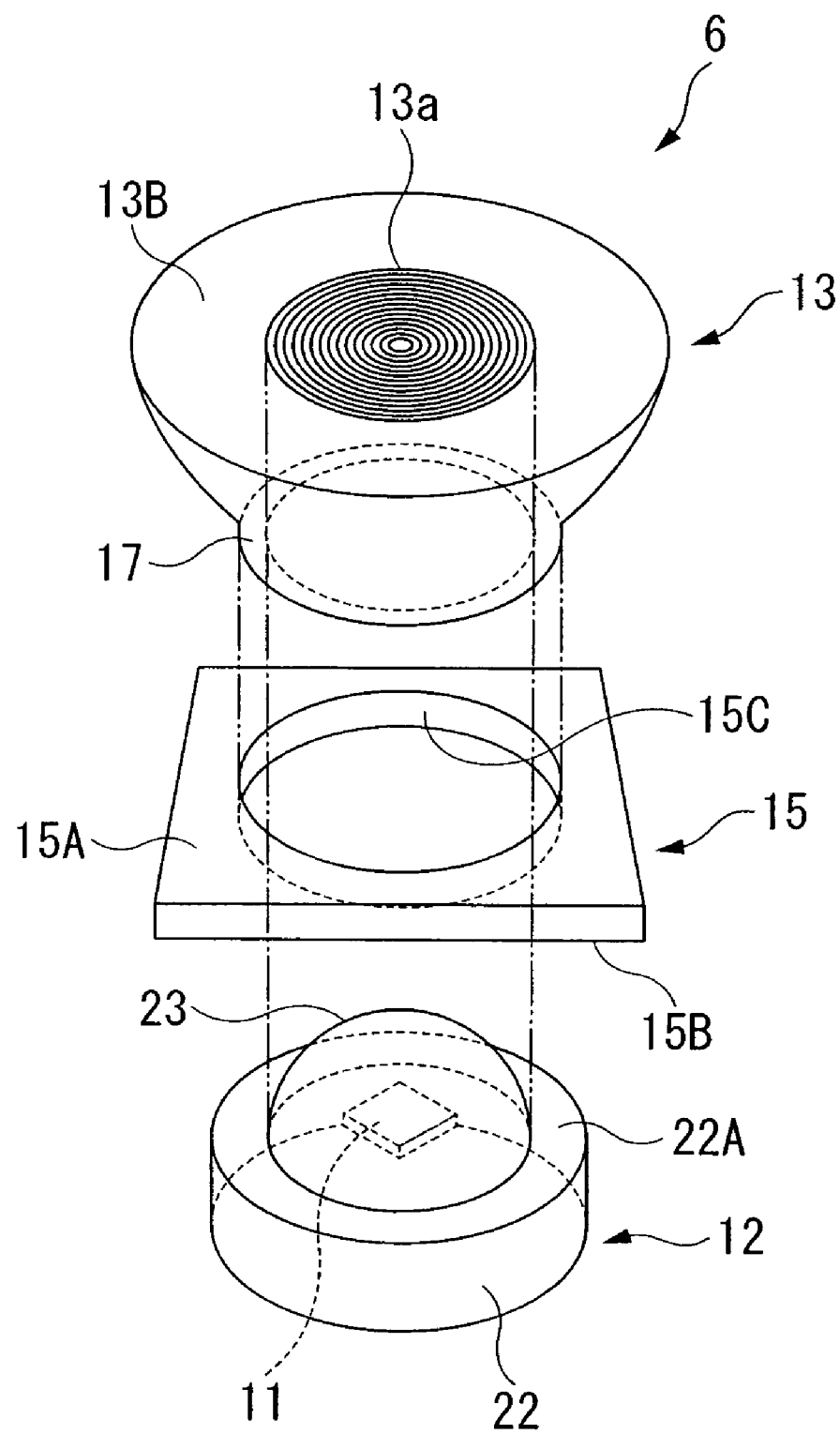
FIG. 5 is an exploded perspective view showing essential portions of the light emitting device according to the first preferred embodiment of the present invention.
Figure 6:
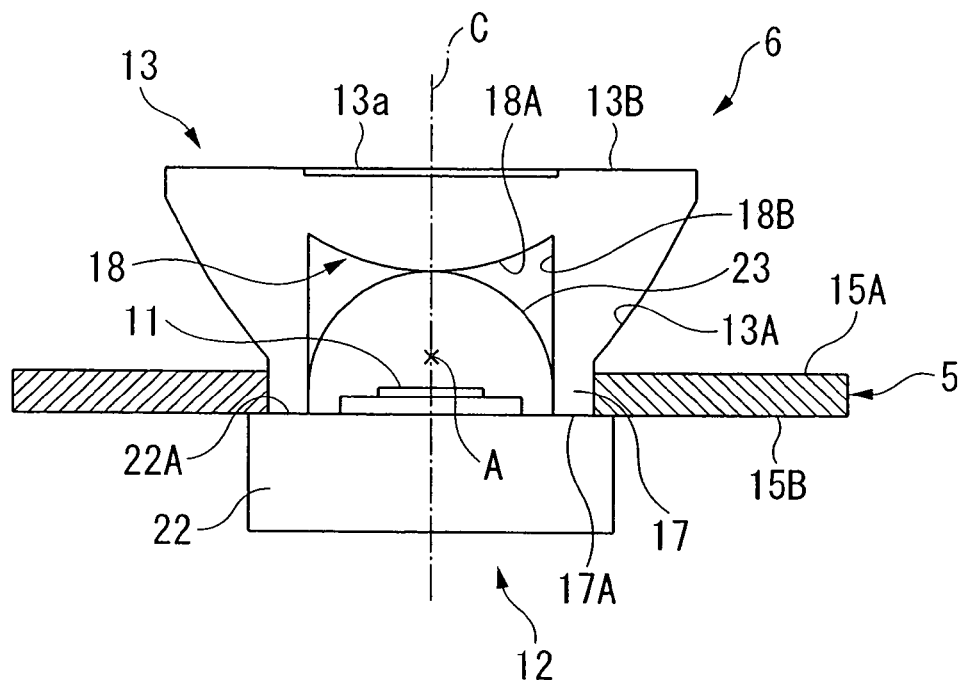
FIG. 6 is a sectional view showing essential portions of the light emitting device according to the first preferred embodiment of the present invention.
Figure 7:
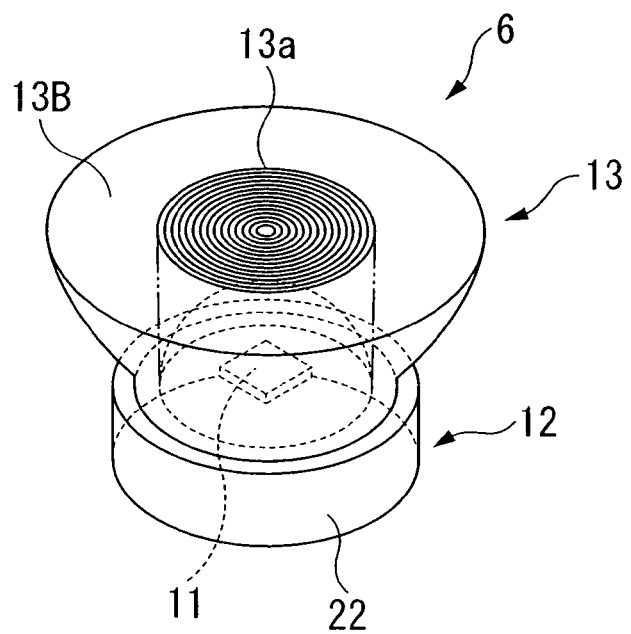
FIG. 7 is a perspective view showing essential portions of the light emitting device according to the first preferred embodiment of the present invention.

One of the optical elements 13 is shown in FIGS. 5 through 7. This optical element 13 has an insertion portion 17 (a first convex portion) which is formed so as to protrude from its main body in the form of a circular post which can be snugly fitted into the through hole 15C, thus having an outer diameter which is approximately equal to the inner diameter of the through hole 15C; and, inside the insertion portion 17, there is formed a concave portion 18, which has the form of a hole which is cylindrical in cross section, and which is substantially coaxial with the cylindrical insertion portion 17.

The outer diameter of the insertion portion 17 of the optical element 13 is made so as to be substantially equal to the inner diameter of the through hole 15C to which it corresponds, so that it can be snugly fitted therein. And the tip end surface of the insertion portion 17 is made as an first annular plane surface 17A which, when the optical element 13 is thus fitted into its through hole 15C, comes to be approximately parallel with the circumferentially outer side surface 15B of the holder portion 15, so as to be able to contact against the LED 12, as will be described hereinafter.

As shown in FIG. 8A, the first annular plane surface 17A is made as a projecting contact surface, having ejection pins (removal elements), which are used when forming the optical element 13 for removing it from the mold, and which have contact portions 20A which are formed as circular posts.

It should be understood that, as shown in FIG. 8B, it would also be acceptable to provide, as the ejection pins 21, contact portions 21A which are formed as curved around in the circumferential direction of the first annular plane surface 17A, in order for their area to be greater than the contact area of the above described contact portions 20A.

Furthermore, the optical element 13 has a reflection surface 13A which is shaped as a paraboloid of revolution, and converts the diffused light which is incident from the concave portion 18 into approximately parallel rays of light, and an emission end surface 13B which emits to the outside the light which has been incident upon the concave portion 18, and the light which has, as above, been converted into approximately parallel light rays by the reflection surface 13A.

The focal point position of the reflection surface 13A (the point A in FIG. 6) is positioned upon the axis C which, along with passing through the approximately central position of the through hole 15C, is also orthogonal to the first annular plane surface 17A.

The bottom surface 18A of the concave portion 18 is made as a convex shaped aspheric lens. Furthermore, a Fresnel lens 13a is formed upon the surface of the emission end surface 13B which confronts the bottom surface portion 18A of the concave portion 18.

Furthermore, the light from the LED 12 is incident into the body of the optical element 13 from the bottom surface 18A of the concave portion 18, and from its side surface 18B.

The LED 12 has a base portion 22 upon which a light emission portion 11 is provided, and a lens portion (a second convex portion) 23 which is formed as a hemisphere, and which, along with being mounted over the center of the light emission portion 11 and covering it, also can fit snugly into the concave portion 18 of the optical element 13. It should be understood that the light emission portion 11 is arranged so that its central position, along with the central position of the LED 12, both fall upon the axis C.

The outer diameter of the lens portion 23 is made to be approximately the same as the inner diameter of the concave portion 18 which is formed in the insertion portion 17 of the optical element 13, into which it fits, so that it can be snugly held therein.

It should be understood that the lens portion is not limited to being hemispherical, and it may, alternatively, be formed as a rectangular prism. In the case, the concave portion of the optical element also should be made in the shape of a rectangular prism, so that the lens portion can fit thereinto.

The base portion 22 of the LED 12 is also formed with a second surface 22A which extends approximately parallel with the outer side surface 15B of the holder portion 15, so as to contact against the first annular plane surface 17A.

Thus, when the optical element 13 and the LED 12 are fitted in their corresponding through hole 15C in the holder portion 15, the axial position of the contact between the first annular plane surface 17A of the optical element 13 and the second surface 22A of the LED 12 comes to be at approximately the same axial position as that of the circumferentially outer side surface 15B of the holder portion 15, i.e. at the outer end of the through hole 15C.

As shown in FIG. 3, the pressure member 16 has a first pressure member 16A and a second pressure member 16B, each of which is shaped as half of a cylinder which has been axially divided into two, and these are clamped together so as to exert pressure from mutually opposite directions upon the circumferentially outer side surface 15B of the holder portion 15. When the pressure members 16A and 16B are thus fitted together around the holder portion 15, with the LEDs 12 being fitted in the through holes 15C of the holder portion 15, the cylinder which is defined by the inner surfaces of the pressure members 16A and 16B is of approximately the same diameter as the outer cylindrical surface of a LED base plate 25 (refer to FIG. 2) which is mounted against the base portions of the LEDs 12. Flange portions 16a are formed upon the edge portions at which the two pressure members 16A and 16B join to one another, with bolts 16b being provided for connecting them together.

Due to the bolts 16b being tightened up, the LEDs 12 are pressed via the LED base plate 25 into the holder portion 15 by the pressure members 16A and 16B, thus fixing the LEDs 12 securely into the holder portion 15.

Figure 9:
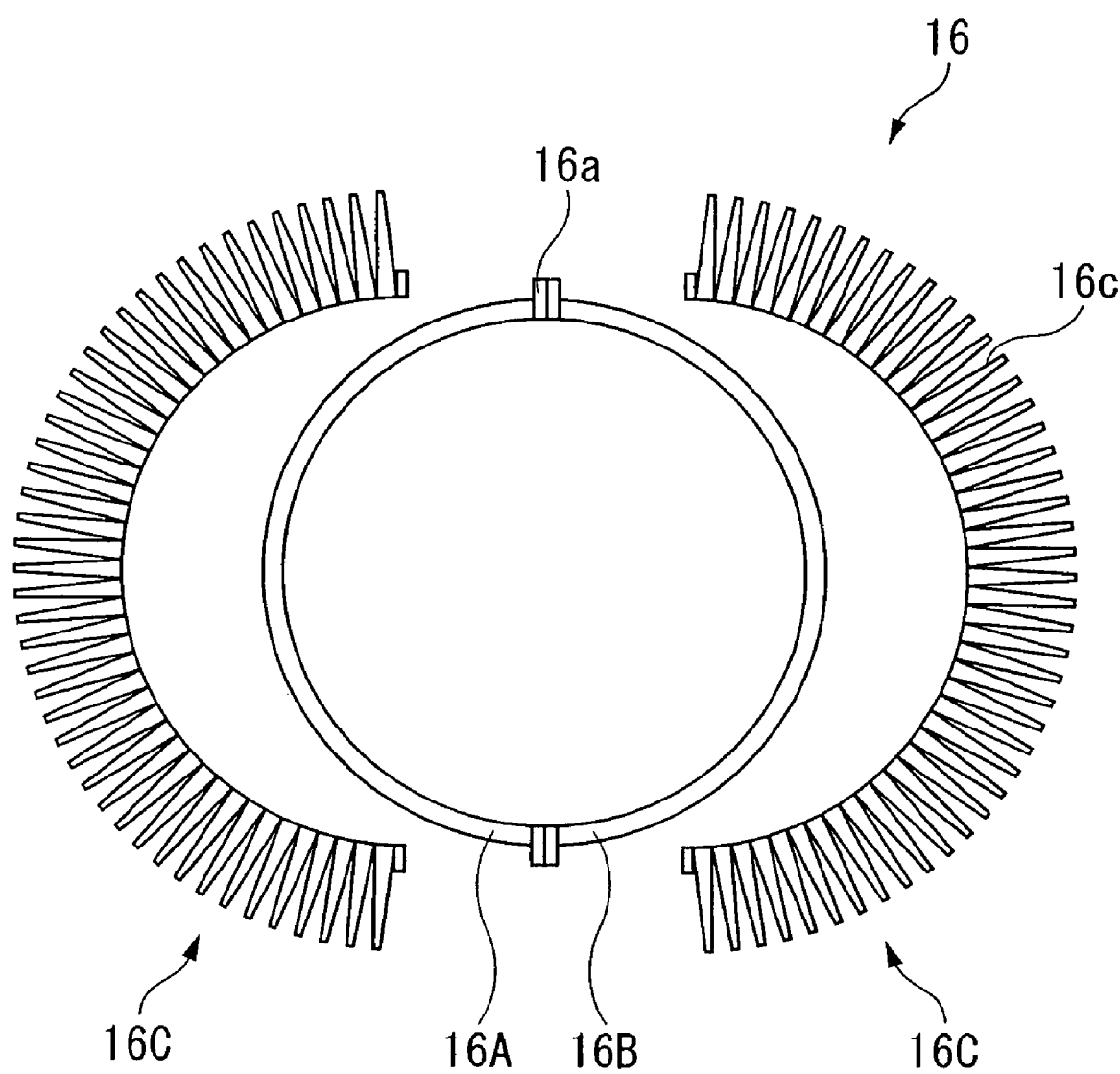
FIG. 9 is a plan view showing a heat radiation section of the light emitting device according to the first preferred embodiment of the present invention.

And, as shown in FIG. 9, a heat radiation section 16C is provided around the pressure member 16, in order to radiate away the heat which is generated by the LEDs 12.

A large number of fins 16c are provided as protruding from the heat radiation section 16C in its radially outward direction.

It should be understood that, as shown in FIG. 2, a heat radiation fan 26 is provided in the vicinity of the heat radiation section 16C, in order to enhance the effectiveness of cooling.

As shown in FIG. 2, the pillar shaped light propagating unit 7 has one parallel rod 27 at the end of which the incident end surface 7A is provided, one bending prism 28 which, along with being connected to the parallel rod 27, changes the direction of the light from the parallel rod 27 with its reflection surface, and one tapered rod 30, which is provided a little separated from the bending prism 28, with the light which has been bent (refracted) by the bending prism 28 being incident upon it across a small gap therebetween, and which propagates the incident light to its emission end surface 7B while reflecting the light off its reflection surface 7C.

The bending prism 28 constitutes a transparent member which has a higher index of refraction than the tapered rod 30 and the parallel rod 27.

Figure 10:
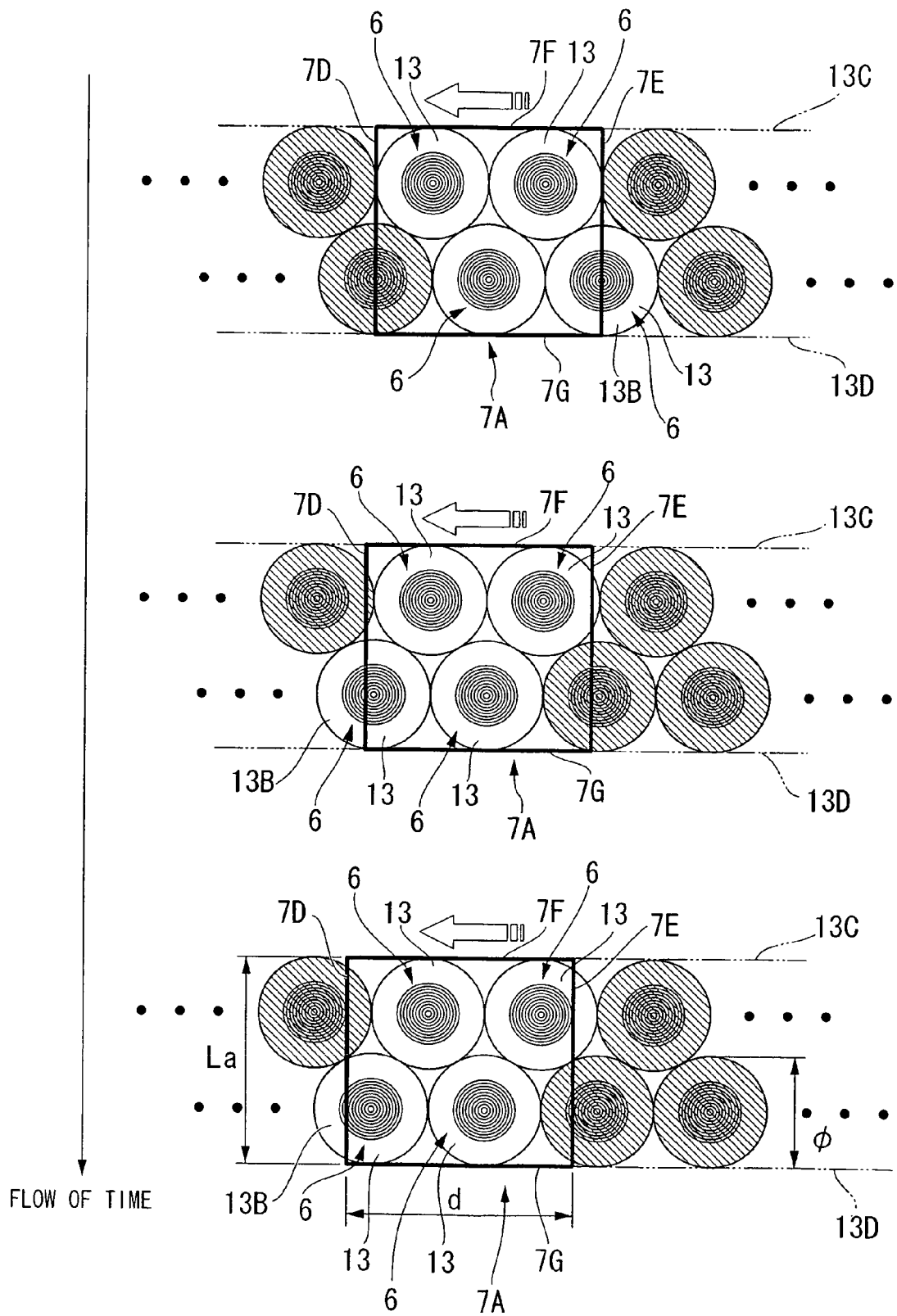
FIG. 10 is an explanatory figure showing the operation of the light emitting device according to the first preferred embodiment of the present invention.

As shown in FIGS. 2 and 10, the incident end surface 7A of the parallel rod 27 is formed as a rectangular surface, which is defined and surrounded by a first pair of sides 7D and 7E which are approximately parallel to the central axial line C1 of the holder portion 15, and by a second pair of sides 7F and 7G which are orthogonal to the first sides 7D and 7E.

As for the size of the incident end surface 7A, it is made to be of a size which can cover about 3.5 of the emission end surfaces 13B of four of the optical elements 13 arranged in a zigzag pattern upon the light emitting device 6 and which are emitting light at the same time (those ones of the optical elements 13 which are not emitting light are shown in FIG. 10 by sloping hatching).

Here, as shown in FIG. 10, the second pair of sides 7F and 7G are arranged so as, respectively, approximately to contact the outer edges in the direction of the central axial line C1 of the optical elements 13 which are disposed in each of the rows of through holes 15D and 15E of the light emitting device 6.

In the case, if the distance between the first pair of sides 7D and 7E is taken as being d, the distance between the second pair of sides 7F and 7G is taken as being L, and the diameter of the emission end surfaces 13B of the optical element 13 is taken as being φ, then the area of the incident end surface 7A is $(1+\sqrt{3}/2) \times \phi \times d$.

It should be understood that, if the number of rows of through holes is taken as being n (in the preferred embodiment of the present invention, n=2), the area of the incident end surface 7A satisfies the relationship: $\phi + (n-1) \times (\sqrt{3}/2) \times \phi \square L < n \times \phi$ The incident end surface 7A of the parallel rod 27 is disposed in a position which confronts the emission end surfaces 13B of the optical elements 13 while being separated therefrom by a small gap. It should be understood that while, in the preferred embodiment, the bending prism 28 totally internally reflects all the light with its total reflection surface 28A, alternatively, it would be acceptable to utilize a metallic mirror coating, or to utilize a multiple layer coating of a dielectric substance.

The emission end surface 28A of the bending prism 28 and the incident end surface 30A of the tapered rod 30 which confronts it are made to be of approximately the same size as one another.

The shift unit 8 has a rotation motor 31, a rotation shaft 32 which is connected to the rotation motor 31, and a rod holder 33, connected to the rotation shaft 32, which is shaped as a circular plate, and to which the parallel rod 27 is connected.

A light emission control unit 10 has a rotation sensor 35 which monitors the amount of rotation of the rod holder 33, a light emission timing control circuit 36 which controls the timing of light emission, by the LEDs 12 based upon a signal from the rotation sensor 35, a LED drive control circuit 37 which controls the drive currents to the LEDs 12 according to a signal from the light emission timing control circuit 36, and a motor drive control circuit 38 which controls the rotation of the rotation motor 31 based upon the signal from the rotation sensor 35. This timing of the emission of light by the plurality of LEDs 12 is performed so as to illuminate the LEDs 12 in order as, along with the rotational shifting of the parallel rod 27 of the pillar shaped light propagating unit 7, the LEDs 12 come to be positioned so as to confront the one incident end surface 7A of the pillar shaped light propagating unit 7.

Next, the method of assembling the light emitting device 6 according to the preferred embodiment of the present invention, and the method of actuation of the image projection apparatus 1, the light emitting apparatus 2, and the light emitting device 6, and their operation and the benefits which they provide, will be explained.

First, the optical elements 13 and the LEDs 12 are fitted to the holder portion 15.

Figure 11A:
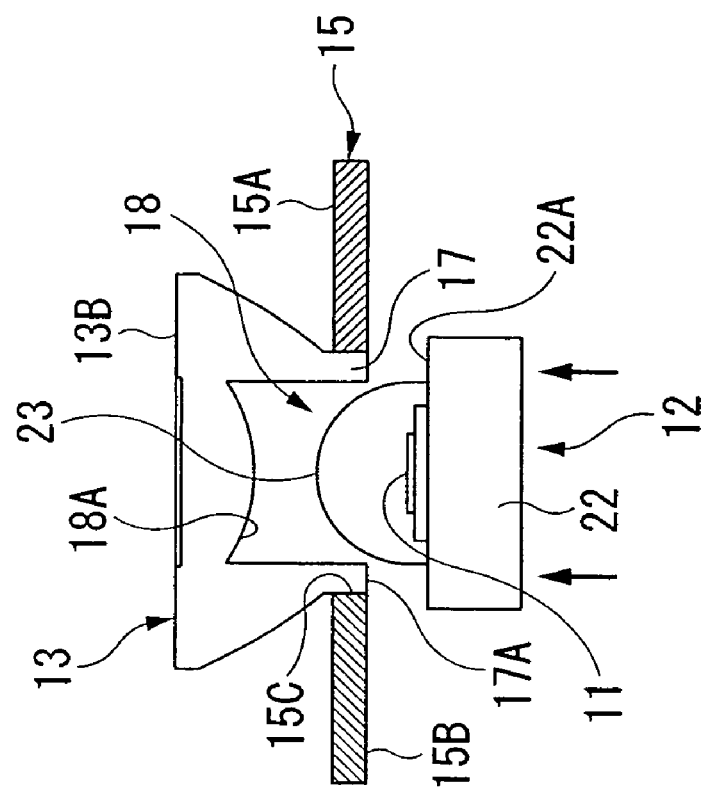
FIG. 11A is an explanatory figure showing a stage in the process of assembly of the light emitting device according to the first preferred embodiment of the present invention.

In other words, the insertion portion 17 of each of the optical element 13 is inserted into and engaged into its through hole 15C from the side of the inner circumferential side surface 15A of the holder portion 15. At the time, as shown in FIG. 11A, along with the emission end surface of the optical element 13 being pressed towards the holder portion 15 by a press in fitting tool 39A, a fixed support tool 39B is approached from the side of the circumferentially outer side surface 15B of the holder portion 15, i.e. from the other side of the holder portion 15, so as to reach to a position at which it is coplanar with the circumferentially outer side surface 15B of the holder portion 15, thus ensuring that the first annular plane surface 17A of the insertion portion 17 is also brought to be coplanar therewith; and, at the time, the optical element 13 is pressed from both its sides.

Figure 11B:
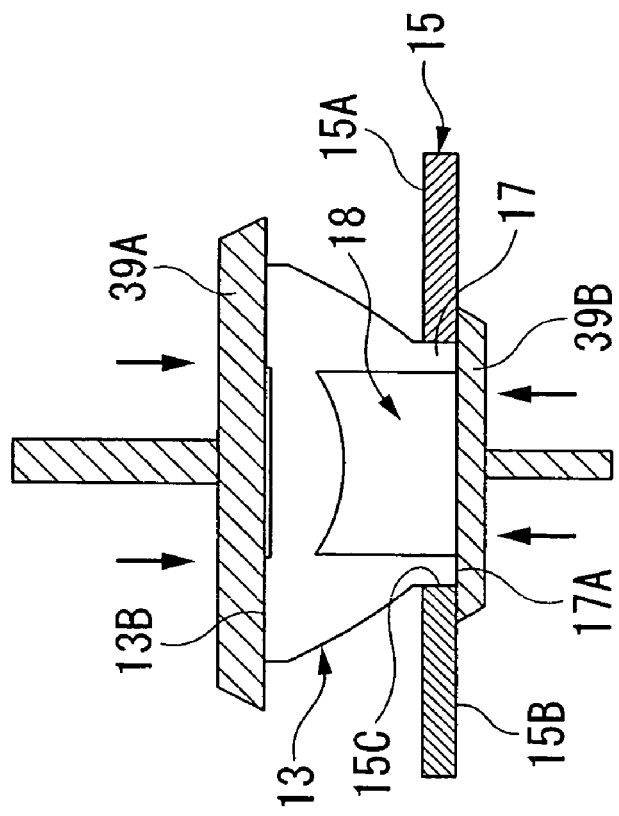
FIG. 11B is a an explanatory figure showing a stage in the process of assembly of the light emitting device according to the first preferred embodiment of the present invention.

Next, as shown in FIG. 11B, the lens portion 23 of the LED 12 is inserted, from the circumferentially outer side surface 15b of the holder portion 15, into the concave portion 18 of the optical element 13 from the opening of the through hole 15C, until the first annular plane surface 17A of the insertion portion 17 of the optical element 13 and the second surface 22A of the base portion 22 of the LED 12 contact one another, and thus the LED 12 comes to be engaged with the concave portion 18, as shown in FIG. 6. In the manner, as shown in FIG. 7, the optical element 13 and the LED 12 are both engaged into and fixed with respect to the holder portion 15.

Figure 12:
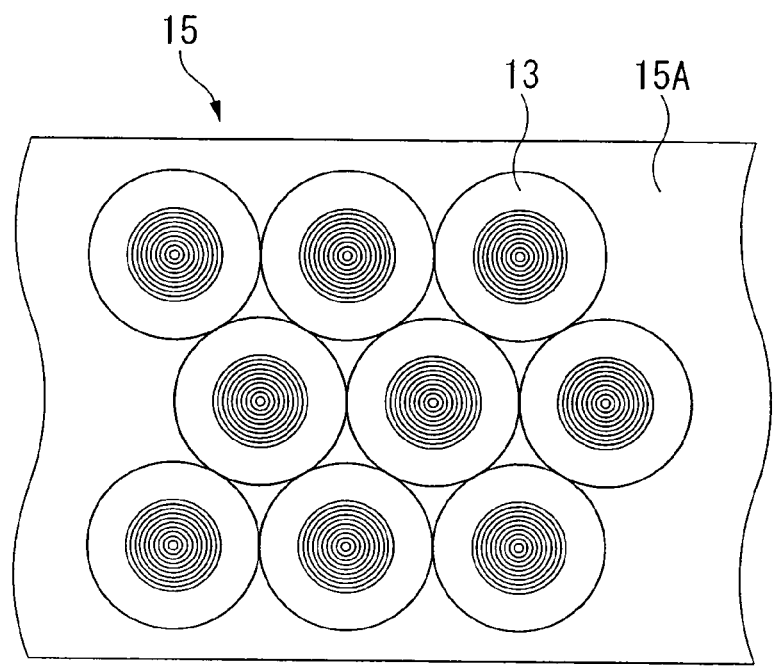
FIG. 12 is a partial enlarged view showing the light emitting device according to the first preferred embodiment of the present invention.

The above task is performed for each of the through holes 15C, so that finally, as shown in FIG. 12, when seen from the circumferentially inner side surface 15A of the holder portion 15, the emission end surfaces 13B of the optical elements 13 are packed together at the maximum possible density.

And then the first pressure member 16A and the second pressure member 16B are connected together, and the two of them are fixed together by the bolts. Thereby, the light emitting device 6 is obtained.

Next, the operation when the diffused light which is generated from the light emission portions 11 of the LEDs 12 is being emitted from the emission end surfaces 13B of the optical elements 13 will be explained.

Figure 13:
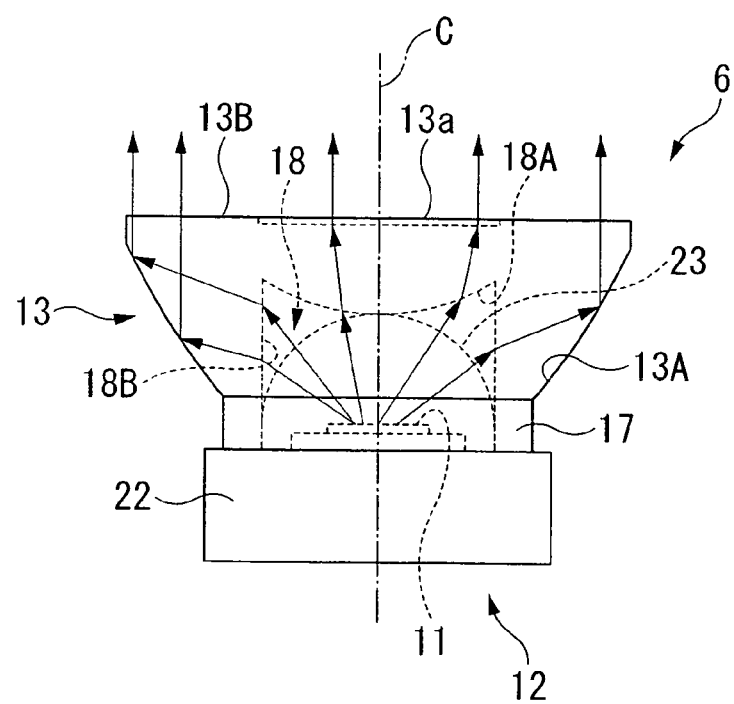
FIG. 13 is an explanatory figure showing the operation of the light emitting device according to the first preferred embodiment of the present invention.

As shown in FIG. 13, among the light which has been radiated from a representative one of the LEDs 12, the light whose rays are proceeding at a comparatively narrow angle is bent (refracted) by the bottom surface 18A of the concave portion 18 of the optical element 13 which is formed as an aspheric lens, and then, at the upper surface of the optical element 13, is converted by the Fresnel lens 13a which is formed in the central portion of the emission end surface 13B into light which has a high degree of parallelism. Furthermore, the light among the light which has been radiated from the LED 12 whose rays are proceeding at a comparatively wide angle is bent by the cylindrical side surface 18B of the concave portion 18 of the optical element 13 as it is incident into the body of the optical element 13 surrounding the wall of the concave portion 18, and then is totally internally reflected by the reflection surface 13A so as to proceed approximately parallel to the axis C of the optical element 13, finally being emitted from the radially outward portion of the emission end surface 13B, thus bypassing the Fresnel lens 13a.

Figure 14:
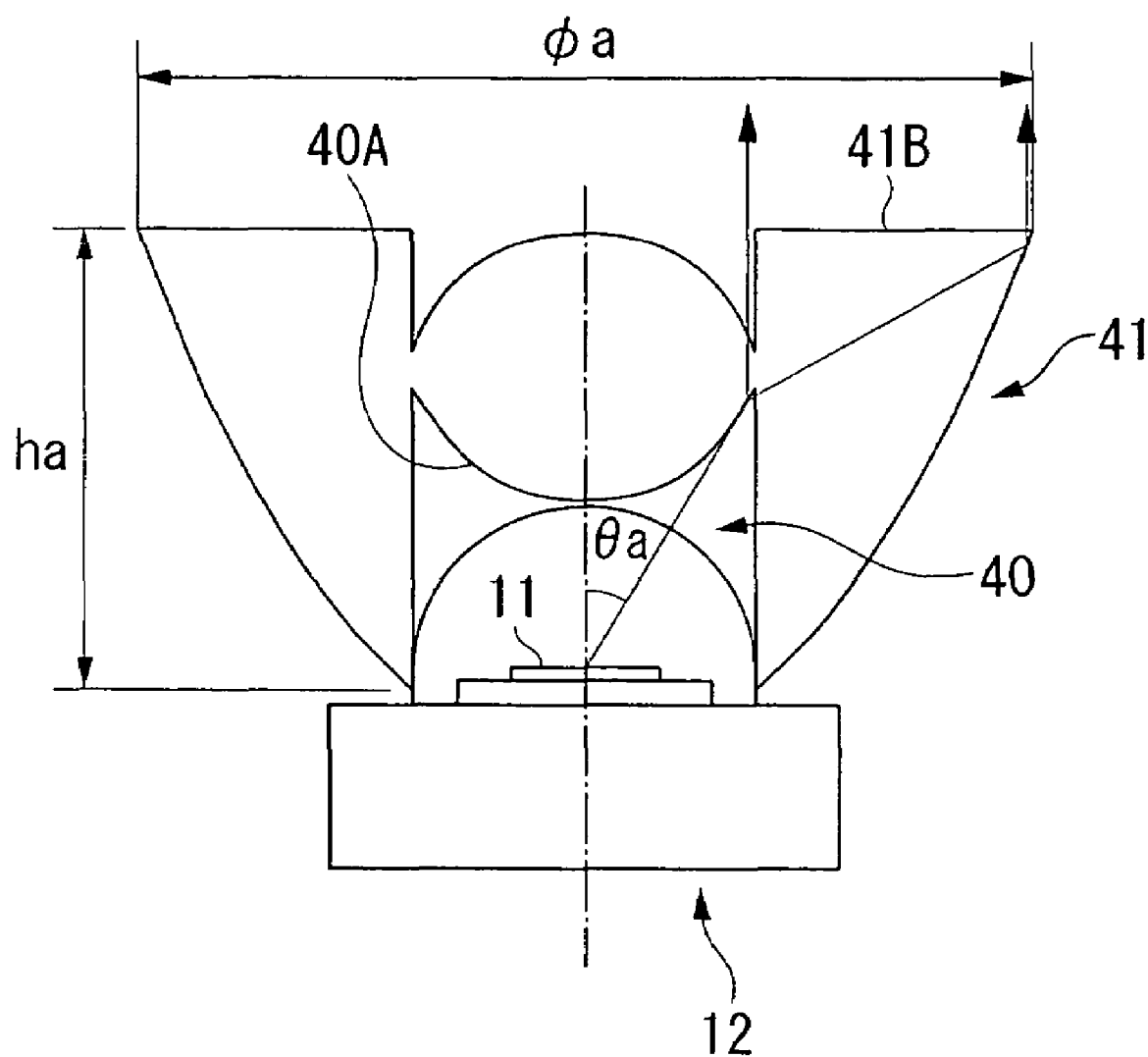
FIG. 14 is an explanatory figure showing one comparison example, for explanation of the operation of the light emitting device according to the first preferred embodiment of the present invention.
Figure 15:
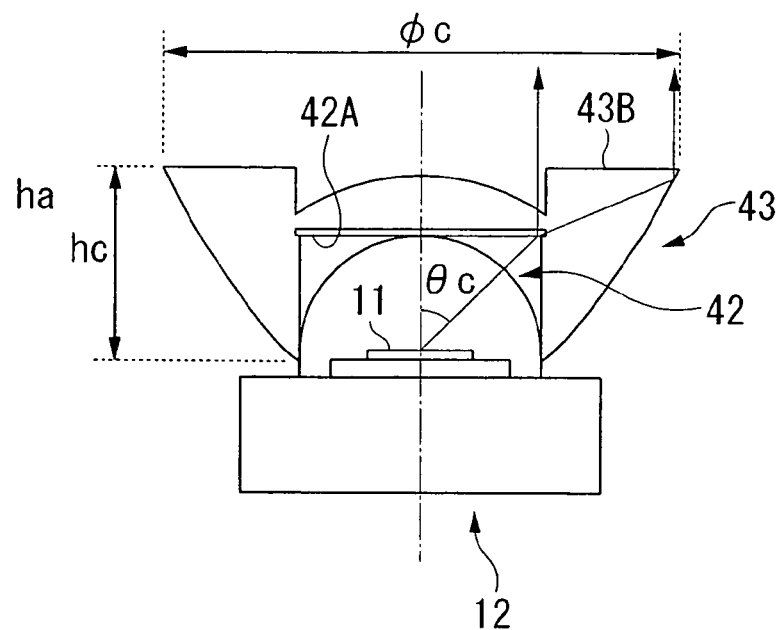
FIG. 15 is an explanatory figure showing another comparison example, for explanation of the operation of the light emitting device according to the first preferred embodiment of the present invention.
Figure 16:
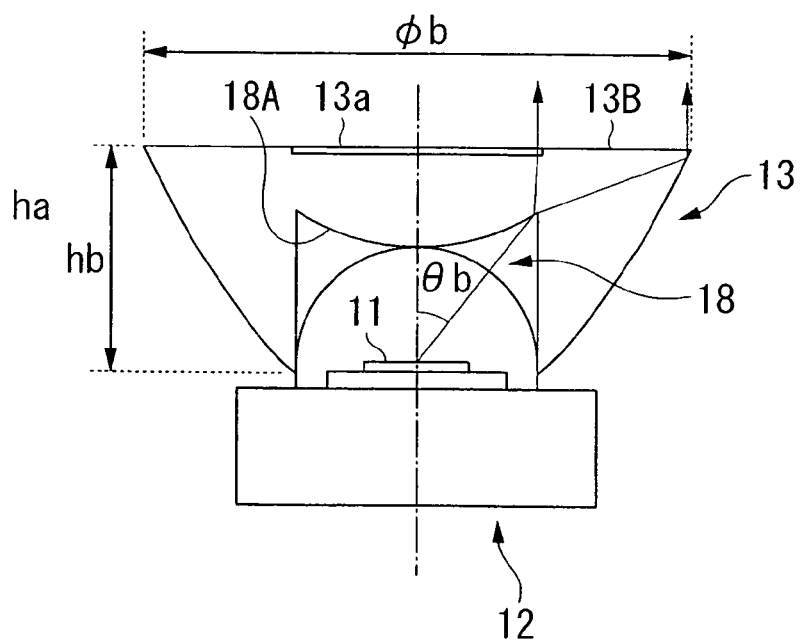
FIG. 16 is an explanatory figure showing the operation of the light emitting device according to the first preferred embodiment of the present invention.

Next, for each of an optical element 41 which, as shown in FIG. 14, is constituted as a thick lens by a bottom surface 40A of a concave portion 40, an optical element 43 of Fresnel structure which, as shown in FIG. 15, is constituted by a bottom surface 42A of a concave portion 42, and the optical element 13 of Fresnel structure according to the preferred embodiment of the present invention which, as shown in FIG. 16, is constituted by the emission end surface 13B of the optical element 13, the relationship between the shape of that optical element and the light rays within that optical element will be explained.

Suppose that, in each of the three respective cases of FIGS. 14, 15, and 16 above, the angle of that light beam, among the radiant light from the central portion of the light emission portion of the LED 12, which is emitted at a relatively narrow angle and is bent (refracted) so as to arrive at the outermost periphery of the bottom surface 40A, 42A, 18A of the respective concave portion 40, 42, 18 is termed $\theta a$, $\theta c$, and $\theta b$, respectively. Furthermore, suppose that the height from the light emitting surface of the light emission portion 11 to the emission end surface 41B, 43B, 13B of the respective optical element 41, 43, 13 is termed ha, hc, and hb, respectively, and that the diameter of the emission surface is termed $\phi a$, $\phi c$, and $\phi b$, respectively.

Suppose that the light which is of a wider angle than the abovementioned light which arrives at the outermost periphery of the bottom surface 40A, 42A, 18A of the respective concave portion 40, 42, 18 is incident from the side surface 40B, 42B, 18B of the respective concave portion 40, 42, 18 thereinto, and is totally internally reflected by the reflection surface 13A; then, $\theta a < \theta b < \theta c$ and $\phi a < \phi b < \phi c$, and moreover ha>hb>hc. Accordingly, if a compact structure is to be realized while obtaining the same type of approximately parallel light, it is desirable to make the construction thin by using a Fresnel lens type structure, as shown in FIGS. 15 and 16. In the case, as shown in FIG. 15, it is possible to make the optical element more compact by making the bottom surface 42A of the concave portion 42 as a Fresnel lens structure, as opposed to forming a Fresnel lens structure upon the emission end surface 43B as in the case of the present invention as shown in FIG. 16. However, with the situation shown in FIG. 15 in which it is the bottom surface 42A of the concave portion 42 which is made as a Fresnel lens structure, since the incidence angle of the light rays upon the Fresnel lens surface becomes great, it is easy for light to be incident into the back-cut surface which is not the surface upon which the Fresnel type lens is provided, and in the case the amount of unnecessary light becomes large, and the efficiency drops undesirably.

Accordingly, as shown in FIG. 16, with the optical element according to the first preferred embodiment of the present invention in which the Fresnel lens structure is provided upon the emission end surface 13B and the bottom surface 18A of the concave portion 18 is made as a lens portion, along with keeping the loss of efficiency smaller and maintaining the high directivity, it is possible to provide a more compact optical element, since the light rays from the bottom surface 18A of the concave portion 18, which have a high degree of parallelism, are incident upon the Fresnel lens 13a.

When the light emitting device 6 is used in the light emitting apparatus 2, first, the rotation motor 31 is driven so as to cause the rod holder 33, which is connected to its rotation shaft 32, to rotate, and thus the parallel rod 27 and the bending prism 28 of the pillar shaped light propagating unit 7 are also caused to rotate.

Figure 17:
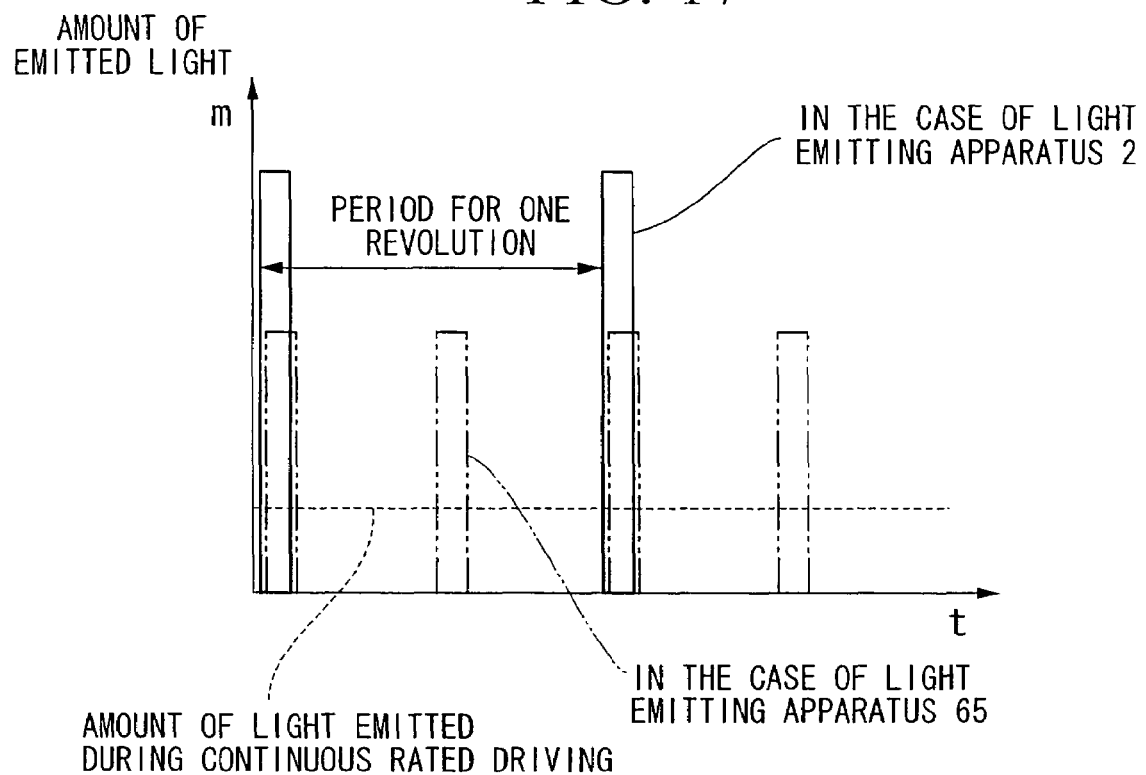
FIG. 17 is a graph showing the difference between the amount of emitted light for a single light emitting device, between the light emitting apparatus according to the first preferred embodiment of the present invention and another light emitting apparatus which is not an embodiment of the present invention.
Figure 18:
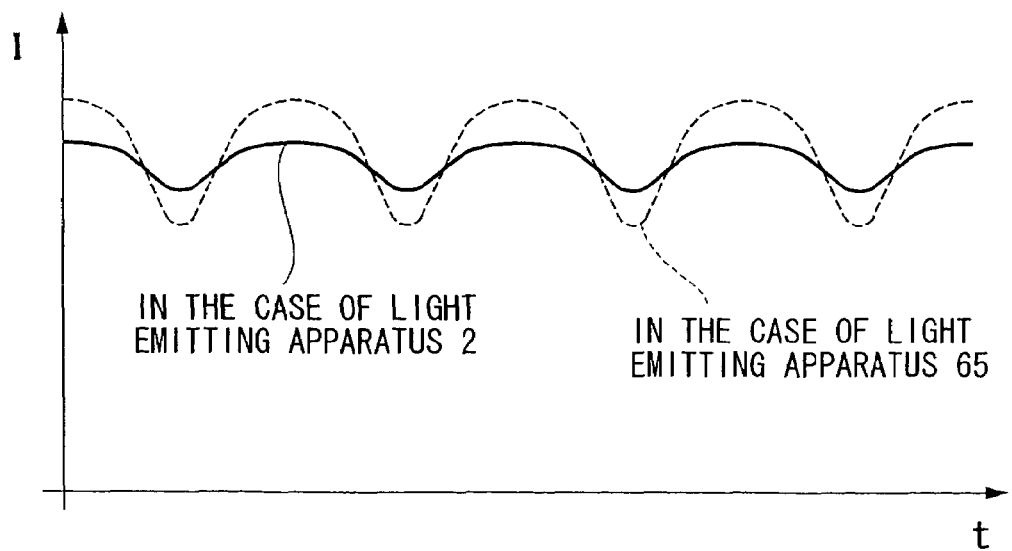
FIG. 18 is a graph showing the difference in the amount of light variation between the light emitting apparatus according to the first preferred embodiment of the present invention and another light emitting apparatus which is not an embodiment of the present invention.

At the time, the amount of rotation of the rod holder 33 is monitored by the rotation sensor 35, and, based upon the signal which has been monitored, the timing of light emission is controlled by the light emission timing control circuit 36, and, as shown in FIG. 10, due to the control by the LED drive control circuit 37, only those ones of the light emitting devices 6 which are opposed to the incident end surface 7A of the parallel rod 27 are caused to emit pulsed light. And, at the time, by sequentially causing light to be emitted by the LEDs 12 in order according to the rotation of the rod holder 33, even though all of the LEDs 12 are not illuminated continuously, as shown in FIG. 17, light of high luminance level is continuously emitted from the emission end surface 7B of the tapered rod 30 in an efficient manner, with each of the LEDs 12 being caused to emit light once for each rotation of the parallel rod 27.

Furthermore, even if there is variation or the like in the amount of light which is emitted by the LEDs 12, by feedback controlling the drive current for the LEDs 12, based upon the signal which has been monitored, so as to bring the amount of light to be the most appropriate value, light of an even quality may be finally obtained.

The light which has been obtained in the manner, which has high luminance and moreover a high degree of parallelism, is supplied to the LCD panel 3, and, via the projection lens 5, projects the image which is outputted in magnified form upon a screen or a whiteboard which is not shown in the figures.

According to the light emitting device 6 which has the holder portion 15 which is formed with the through holes 15C, it is possible very simply to fix each of the LEDs 12 to the holder portion 15 and to the optical element 13 which corresponds to that LED 12, by engaging the insertion portion 17 of the optical element 13 into the through hole 15C and thereby fixing the optical element 13 to the holder portion 15, and by then inserting the lens portion 23 of the LED 12 into the through hole 15C and engaging it with the concave portion 18 of the optical element 13; and, in the manner, it is possible easily to assemble together all of the optical elements 13 and the LEDs 12.

At the time, since both the insertion portion 17 and the through hole 15C into which it is to be engaged are formed as circular, they both can be manufactured very easily (i.e. they have high manufacturability), and it is possible easily to obtain high positional accuracy in them in the fixing direction.

Furthermore, it is possible to fix the optical elements 13 and the LEDs 12 to the holder portion 15 in the state in which the first annular plane surfaces 17A of the optical elements 13 and the second surfaces 22A of the LEDs 12 are in contact with one another. At the time, their positions of contact are not within their respective ones of the through holes 15C, but rather are approximately positioned at the circumferentially outer side surface 15B on the outer side of the holder portion 15, so that it is possible to fix the first annular plane surfaces 17A and the second surfaces 22A together while ensuring their proper state of mutual contact, and it is possible easily to position them with good accuracy.

Furthermore, by providing the ejection pins 20 as protruding from the contact plane of the first annular plane surface 17A when manufacturing each of the optical elements 13, it is possible easily to perform removal of the optical element 13 from the mold.

Yet further, since the focal point position of the parabolic surface, which is the reflection surface 13A of the optical element 13, is positioned as described above, accordingly the optical element 13 is not required to have any complicated shape involving a tilt or the like, so that it is possible to enhance the ease of manufacture, by making it more easy to manufacture the injection mold for the optical element 13.

And, since the LEDs 12 are pressed into the holder portion 15 by the pressure member 16 which is held together by the bolts 16b, accordingly, when changing over one of the LEDs 12 or one of the optical elements 13, it is possible easily to remove that LED 12 or optical element 13 from the holder portion 15 by removing the pressure of the pressure member 16, simply by undoing the bolts 16b.

Furthermore, since the heat radiation section 16C is provided to the holder portion 15, accordingly, even if a high output luminance is required and the drive current is therefore supplied at a high level to the LEDs 12, the heat which is emitted by the LEDs 12 can be efficiently radiated away by that heat radiation section 16C, so that the system is thermally stable, and, moreover, it is possible to obtain light of high luminance.

Yet further, since the holder portion 15 is formed in the shape of a circular tube, when the plurality of LEDs 12 are disposed in their respective through holes 15C, it is possible to obtain light of high luminance by collecting together the light from the LEDs 12, which is directed within a fixed region in the direction of the central axis of the holder portion 15.

At the time it is possible to produce the central portion of the holder portion 15 more easily, by forming the holder portion 15 in the shape of a cylinder.

Even further, it is possible to ensure that the direction of the approximately parallel light is made to be the direction of the axis C, so that, when the LEDs 12 and the optical elements 13 are fitted to the holder portion 15, it is possible to obtain desirable optical characteristics.

Still further, according to the light emitting apparatus 2, along with arranging the plurality of optical elements 13 and LEDs 12, and causing them to emit pulsed light in order by selecting the LEDs 12 and changing over their light emitting states appropriately, by shifting the relative positional relationship to the LEDs 12 of the parallel rod 27 which is capturing the light which is thus radiated in accordance with the changing over of the light emitting states of the LEDs 12, it is possible to supply large quantities of light of high luminance in an efficient manner.

At the time, when attention is directed to a single one of the LEDs 12, as shown in FIG. 17, the multiplication of the current value when emitting pulsed light with respect to the rated current value as shown by the broken line depends upon the light emission duty ratio, and, the smaller is the duty ratio, the more can the current value be increased. Accordingly, as shown by the solid line, when the LED 12 is caused to emit light once for one revolution, it is possible to supply a current value which is higher than the rated current value for light emission, and it is possible to increase the intensity of the light emitted from the LED 12.

Furthermore since, as shown in FIG. 10, the rows of through holes 15D and 15E are arranged at high density in a zigzag configuration upon the light emitting device 6, and moreover the second pair of sides 7F and 7G of the incident end surface 7A are arranged so as approximately to contact the outer edges in the direction of the central axial line C of the optical elements 13 of the light emitting device 6 which are arranged in the rows of through holes 15D and 15E, accordingly it is possible to propagate the light from the emission end surfaces 13B of the optical elements 13 to the pillar shaped light propagating unit 7 by taking the light into the incident end surface 7A thereof with hardly any loss, so that it is possible to obtain light at high efficiency, while suppressing losses of efficiency during the capture of the light.

Since, at the time, if the diameter of the emission end surface 13B of the optical elements 13 is termed $\phi$, and the distance between the second pair of sides 7F and 7G is termed L, the relationship $(1+\sqrt{3}/2) \times \phi \square L < 2 \times \phi$ is satisfied, accordingly, even when the incident end surface 7A shifts due to rotation of the pillar shaped light propagating unit 7, the total area of the emission end surfaces 13B for the optical element 13 of the light emitting device 6 of which the corresponding LEDs 12 are emitting light towards the incident end surface 7A can always be kept almost constant at, for example, about 3.5 times the area of one such emission end surface 13B. Accordingly, on the one hand, it is possible to receive the light in a secure manner, and it is possible to suppress to the minimum possible limit the region upon which light is not incident; and moreover, as shown by the solid line in FIG. 18, it is possible to reduce the amount of light variation to a relatively low level.

Yet further, with regard to the total area of the emission end surfaces 13B of the light emitting device 6 which confront the pillar shaped light propagating unit 7 at all times, it is possible to reduce the loss of "Etendue" by appropriately suppressing loss of area due to difference in the shape of the incident end surface 7A upon the pillar shaped light propagating unit 7, so that it is possible to obtain light at high efficiency.

Since, at the time, the single parallel rod 27 is shifted by being rotated, accordingly it is possible to provide the light which is to be emitted from the emission end surface 7B of the pillar shaped light propagating unit 7 entirely with the light which is incident upon the single incident end surface 7A thereof, so that, as a consequence, it is possible to obtain light at high efficiency and also of a more even nature.

Even further, even though the radiant light from the LEDs 12 is diffused light, since it is conducted to be incident upon the pillar shaped light propagating unit 7 after having been converted into light of a high degree of parallelism by the optical elements 13 which have high directivity, accordingly it is possible to implement light emitting with a low degree of loss.

Therefore, according to the image projection apparatus 1, it is possible to supply a high quality projected image upon a large screen clearly, with no blurring.

Figure 19:
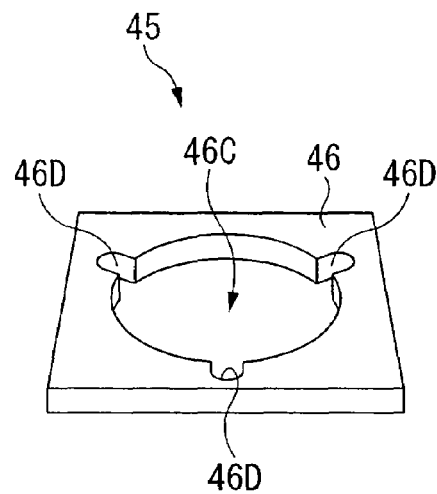
FIG. 19 is a perspective view showing a holder portion of the light emitting device according to the second preferred embodiment of the present invention.
Figure 20:
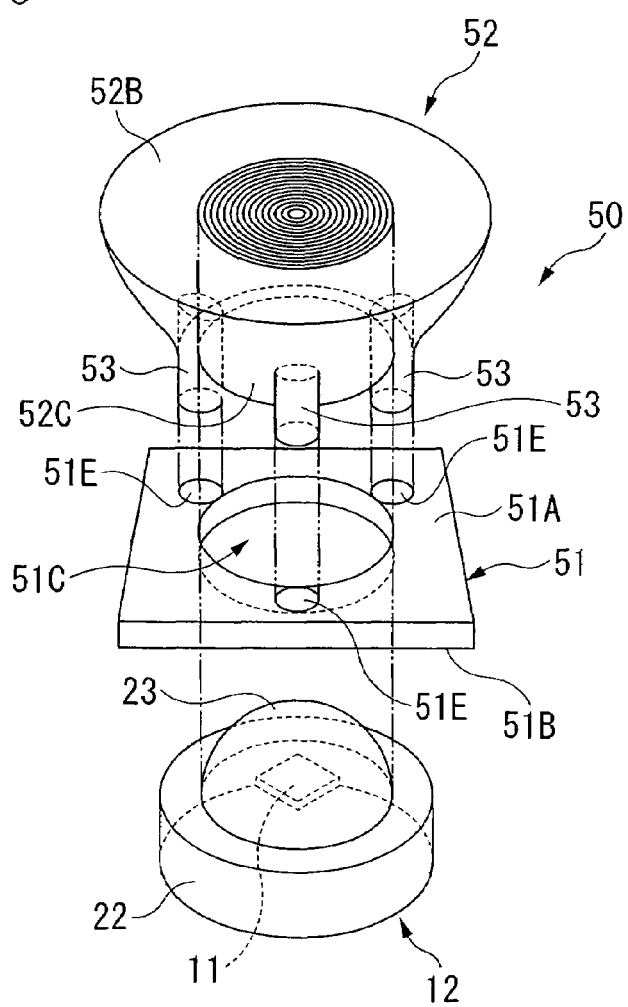
FIG. 20 is a structural view showing essential portions of the light emitting device according to the third preferred embodiment of the present invention.
Figure 21:
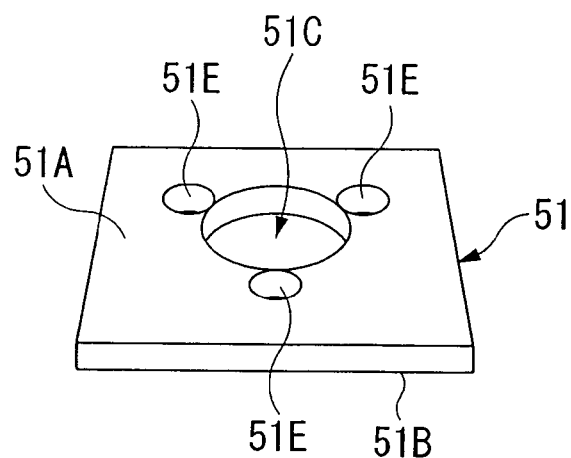
FIG. 21 is a perspective view showing the holder portion of the light emitting device according to the third preferred embodiment of the present invention.

Next, a second preferred embodiment of the present invention will be explained with reference to FIG. 19.

It should be understood that, to structural elements of the second preferred embodiment which are the same as in the first preferred embodiment described above, and which have the same functions, the same reference symbols will be affixed, and the explanation thereof will be curtailed.

The point in which the second preferred embodiment of the present invention differs from the first preferred embodiment described above, is that, with each of the light emitting devices 45 of the second preferred embodiment, at portions of the corresponding through hole 46C in the holder portion 46, there are provided gap portions 46D (three, in the particular constructional example shown in the drawings), for avoiding contact with the side surface of the insertion portion 17 of the optical element 13, when the insertion portion 17 has been inserted into the through hole 46C.

Furthermore, the optical element 13 and the holder portion 46 are fixed together with adhesive which is applied into the through holes 46C.

According to the light emitting device 45 of the second preferred embodiment of the present invention, it is possible to keep the optical elements 13 securely and easily fixed in the holder portion 46, even without providing any pressure member 16, such as was used in the case of the light emitting device 6 according to the first preferred embodiment, described above.

At the time, it is possible to allow excess adhesive to remain in the gap portions 46D, whereby it is possible to easily perform the work of adhesion.

It should be understood that although, as the adhesive, a silicone type adhesive, an epoxy type adhesive, or the like may be used, it is preferred to use a UV hardening type adhesive, from the point of view of the convenience of working.

Next, a third preferred embodiment of the present invention will be explained with reference to FIGS. 20 through 23.

Figure 22A:
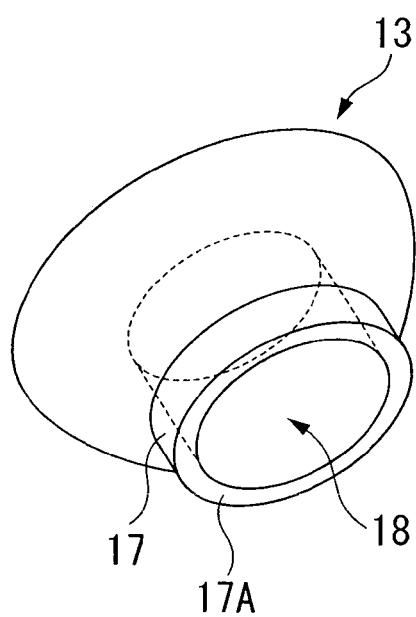
FIG. 22A is a perspective view showing an optical element of the light emitting device according to the first preferred embodiment of the present invention.
Figure 22B:
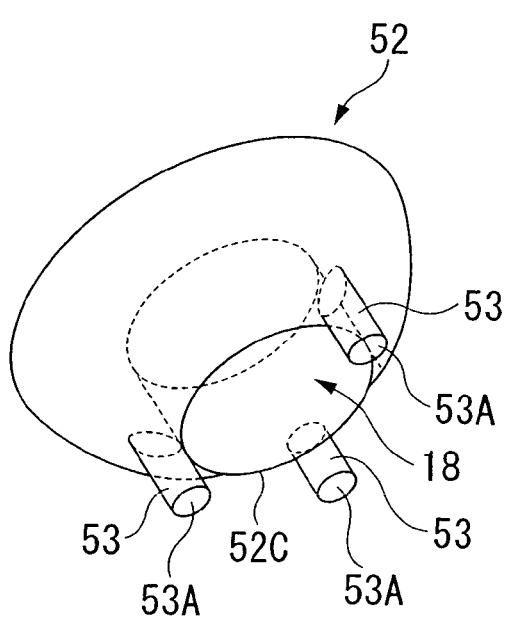
FIG. 22B is a perspective view showing an optical element of the light emitting device according to the third preferred embodiment of the present invention.

It should be understood that, to structural elements of the third preferred embodiment which are the same as in the first and second preferred embodiments described above, and which have the same functions, the same reference symbols will be affixed, and the explanation thereof will be curtailed. The point in which the third preferred embodiment of the present invention differs from the first preferred embodiment described above, is that, as shown in FIGS. 20 and 21, for each of the light emitting devices 50 of the third preferred embodiment, neighboring the corresponding through hole 52C of the holder portion 51, there are provided three reception portions (apertures) 51E in the holder portion 51, which open to both the one side surface 51A and the other side surface 51B thereof; and that, upon the optical element 52, instead of the insertion portion 17 according to the first preferred embodiment as shown in FIG. 22A, there is formed, as shown in FIG. 22B, a protruding portion 52C which protrudes so that the portion of the optical element 52 is able to engage with the through hole 51C, and also, facing in the direction in which the protruding portion 52C protrudes, there are provided three holding portions 53, which stand out from the side surface of the optical element 52, and each of which can each be inserted into one of the reception portions 51E.

The tip end surfaces 53A of the holding portions 53 are all formed as plane surfaces, and they all are mutually coplanar, thus lying in the same plane.

When assembling the light emitting device 50, at the same time as inserting the protruding portion 52C of the optical element 52 into the through hole 51C from the side of the one side surface 51A of the holder portion 51 and engaging it thereinto, the holding portions 53 are engaged into their respective ones of the reception portions (apertures) 51E. At the time, along with pressing a press in fitting tool 39A on the side of the holder portion 51 in the same manner as with the first preferred embodiment of the present invention described above, a fixed support tool 39B is pressed from the other side surface 51B of the holder portion 51, so as to ensure that the first surfaces 53A at the ends of the holding portions 53 of the optical element 52 and the other side surface 51B of the holder portion 51 coincide with one another, and by squeezing the assembly from both its sides, between the tools 39A and 39B.

Next, the lens portion of the LED 12 is inserted into the opening of the through hole 51C from the other side surface 51B, up until the first surfaces 53A of the holding portions 53 and the second surface 22A of the base portion 22 of the LED 12 come into contact with one another, so that it is engaged with the concave portion 18. By doing the, the optical element 52 and the LED 12 are both fixed with respect to the holder portion 51.

The above task is performed for each of the optical elements 52, LEDs 12, and through holes 51C, and then the first pressure member 16A and the second pressure member 16B are clamped together around the entire construction so as to apply radially inward pressure thereto, and are bolted together. In the manner, the light emitting device 50 is obtained.

Figure 23:
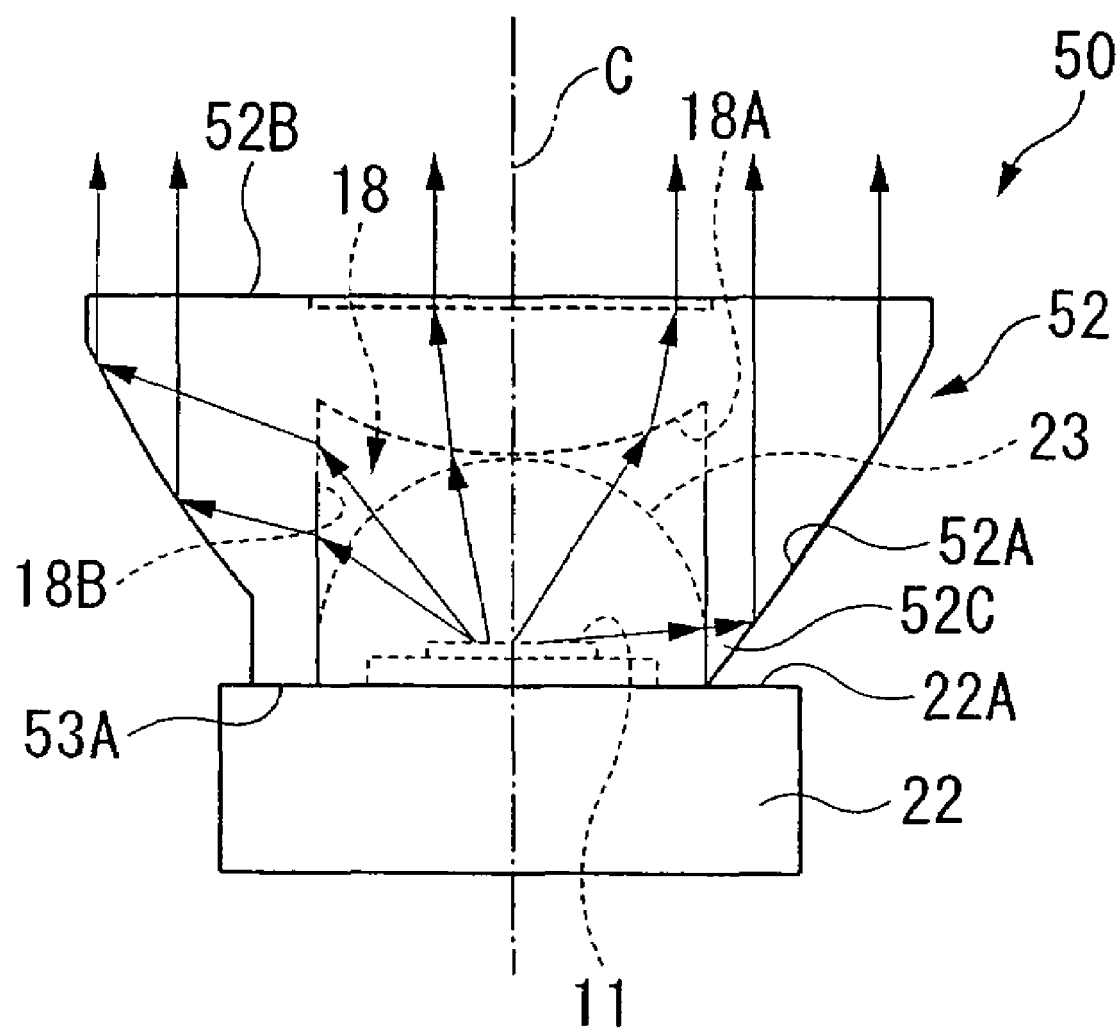
FIG. 23 is an explanatory figure showing the operation of the light emitting device according to the third preferred embodiment of the present invention.

It should be understood that, in the same way as with the second preferred embodiment described above, the optical element 52 may be secured in place with adhesive. As shown in FIG. 23, with the light emitting device 50, among the light which has been radiated from a representative one of the LEDs 12, the light whose rays are proceeding at a comparatively narrow angle is bent by the bottom surface 18A of the concave portion 18 of the optical element 52 which is formed as an aspheric lens, and then, upon being emitted from the upper surface of the optical element 52, is converted by the Fresnel lens which is formed in the central portion of that emission end surface 52B into light which has a high degree of parallelism. Furthermore, the light among the light which has been radiated from the LED 12 whose rays are proceeding at a comparatively wide angle is bent by the cylindrical side surface 18B of the concave portion 18 of the optical element 52 as it is incident into the body of the optical element 52 surrounding the wall of the concave portion 18, and then is totally internally reflected by the reflection surface 52A so as to proceed approximately parallel to the axis C of the optical element 13, finally being emitted from the radially outward portion of the emission end surface, thus bypassing the Fresnel lens.

According to the light emitting device 50 of the third preferred embodiment of the present invention, when fixing each of the optical elements 52 into the holder portion 51, along with engaging its protruding portion 52C into its corresponding through hole 51C, also each of its holding portions 53 is inserted into its corresponding reception portion (aperture) 51E, so that thereby it is possible to assemble the light emitting device with even better positional accuracy that could be obtained according to the first and second embodiments of the present invention described above.

Furthermore, since the reflection surface 52A is formed all the way up to the tip of the protruding portion 52C, accordingly, when the protruding portion 52C has been inserted into the through hole 51C, it is possible to take advantage of the light rays which are emitted from the light emission portion 11 of the LED 12 at all angles, all the way up to a wider angle from its central axis than in the case of the first preferred embodiment of the present invention described above.

Comparison of the Various Embodiments

Figure 24:
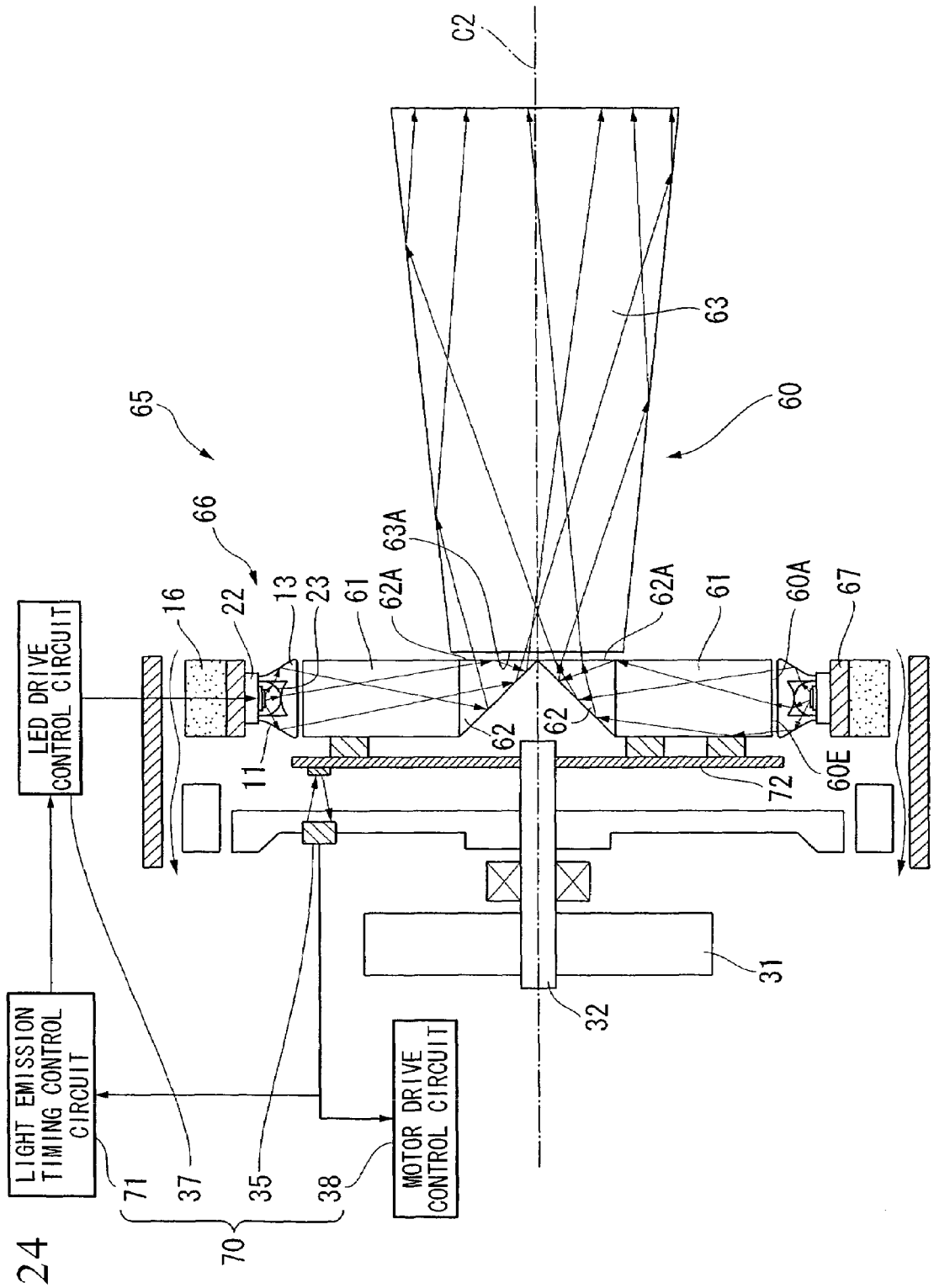
FIG. 24 is a structural view showing another light emitting apparatus which is provided with light emitting device according to the first preferred embodiment of the present invention.
Figure 25:
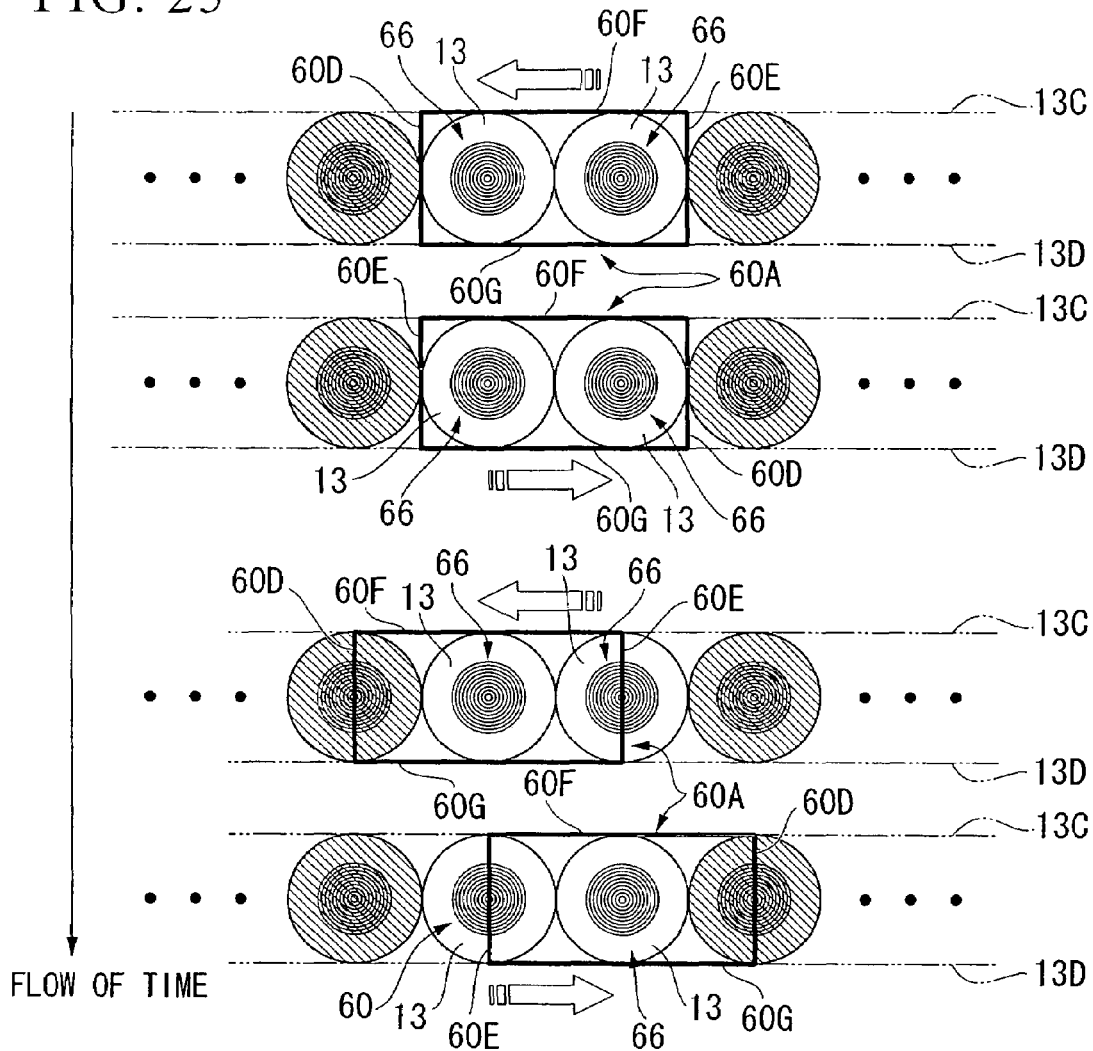
FIG. 25 is an explanatory figure showing the operation of another light emitting apparatus which is provided with the light emitting devices according to the first preferred embodiment of the present invention.
Figure 26A:
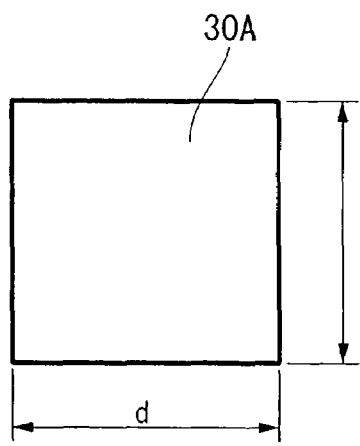
FIG. 26A is an explanatory figure showing an incident end surface of a tapered rod of the light emitting apparatus according to the first preferred embodiment of the present invention.
Figure 26B:
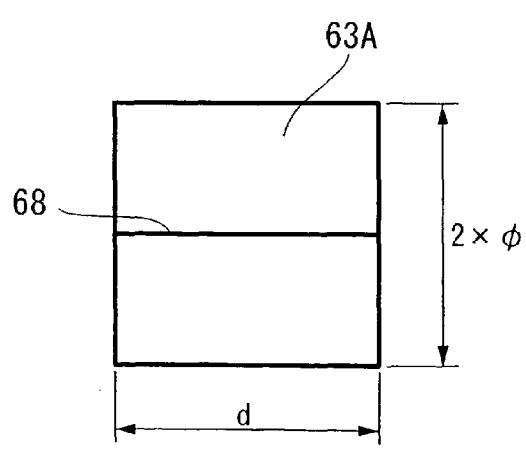
FIG. 26B is an explanatory figure showing an incident end surface of a tapered rod of the other light emitting apparatus of FIG. 24.

The light emitting apparatus 2 according to the first preferred embodiment of the present invention, and a light emitting apparatus 65 (not according to the present invention) in which, as shown in FIGS. 24, 25, and 26B, a pillar shaped light propagating unit 60 has two parallel rods 61 which both have the same shape as one another, two bending prisms 62 which both have the same shape as one another, and a tapered rod 63, will now be compared with regard to their efficiency of providing light emitting, and the like.

It should be understood that the light emitting apparatus 65 which is shown in FIGS. 24, 25, and 26B is the light emitting apparatus shown in Patent Document 4, when optical elements 13 which have emission end surfaces of circular form are used as the LEDs, and furthermore when the emission end surfaces and the incident end surfaces 60A which are provided upon the parallel rods 61 are brought to be close together, so that loss due to "Etendue" is reduced. It should be understood that by "Etendue" is meant the product of the area which is emitting light and the angle of divergence of the light which is emitted.

The parallel rods 61 of the light emitting apparatus 65 are provided so as to extend along a diameter, i.e. orthogonal to the central axial line C2 of a base plate 67 which is formed as a cylinder, to which the light emitting devices 66 are provided.

The light emitting devices 66 is provided with an optical element 13 and a LED 12 which has a light emission portion 11, and the elements are directly fitted to the base plate 67, i.e. not via any holder portion such as the holder portion 15 of the first preferred embodiment of the present invention; and a plurality of light emitting devices 66 are arranged along a single row which extends as an annulus around the central axis C2 of the base plate 67.

As shown in FIG. 25, the incident end surface 60A which is provided to each of the parallel rods 61 is formed as a rectangle which is defined and surrounded by a first pair of sides 60D and 60E which are approximately parallel to the central axial line C2 of the base plate 67, and a second pair of sides 60F and 60G which are orthogonal to that first pair of sides 60D and 60E.

It should be understood that the upper portion of the upper half of FIG. 25 shows the positional relationship between the incident end surface 60A of one of the parallel rods 61 and the light emitting devices 66 which are illuminated, while the lower portion of the upper half of FIG. 25 shows the positional relationship between the incident end surface 60A of the other one of the parallel rods 61 and the light emitting devices 66 which are illuminated, at the same time; thus, FIG. 25 shows both of the relationships. And similarly, the lower half of FIG. 25 shows the state of both of the positional relationships after a certain time period has elapsed.

Thus, the second pair of sides 60F and 60G are arranged so as approximately to contact the outer edges (boundaries) 13C and 13D of the optical elements 13 of the light emitting devices 66 which are provided to the base plate 67, in the direction of the central axial line C2. In the case, the total area of the two incident end surfaces 60A is $2 \times \phi \times d$.

The area of the incident end surface 63A of the tapered rod 63 is twice the area of the emission end surface 62A of each of the two bending prisms 62, both of which oppose it. Accordingly, as shown in FIG. 26B, a prism meeting portion 68 is present at the central position of the incident end surface 63A of the tapered rod 63, which is different from the case in the first preferred embodiment as shown in FIG. 26A.

The light emission control unit 70 has a rotation sensor 35, and a light emission timing control circuit 71, a LED drive control circuit 37, as well as a motor drive control circuit 38, which operate based upon the signal from the rotation sensor 35. The timing of light emission provided by the light emission timing control circuit 71 is matched to the rotational shifting of the parallel rods 61 of the pillar shaped light propagating unit 60, and is arranged so that the plurality of LEDs 12 are caused to emit light in the appropriate order, according to the positions in which they oppose the incident end surfaces 60A of the parallel rods 61.

When operating the light emitting apparatus 65, first, in the same way as with the light emitting apparatus 2 according to the first preferred embodiment of the present invention, the rotation motor 31 is driven and the rod holder 72 which is connected to its rotation shaft 32 is rotated, so that the two parallel rods 61 and the two bending prisms 62 of the pillar shaped light propagating unit 60 are rotated about the central axial line C2.

At the time, as shown in FIG. 25, under the control of the LED drive control circuit 37, only the LEDs 12 which are opposed to the two incident end surfaces 60A of the two parallel rods 61 are caused to emit pulsed light. And, at the time, by the continual operation of the LEDs 12 in appropriate sequence in accordance with and matched to the rotation of the rod holder 33, even though all of the LEDs 12 are not illuminated continuously, as shown in FIG. 17, each one of them is illuminated twice per each one rotation of the parallel rod 61, so that it is possible to take out light of high luminance continuously in an effective manner from the emission end surface 63B of the tapered rod 63.

However, when attention is directed to a single one of the LEDs 12 which are fitted to the light emitting apparatus 65, then, as shown by the double-dotted line in FIG. 17, since it is illuminated twice per each one rotation of the parallel rod 61, accordingly the current value that can be supplied to it (without any danger of premature failure thereof due to overheating or the like) is, undesirably, a lower current value, than in the case of the light emitting apparatus 2 according to the first preferred embodiment of the present invention, in the case of which each of the LEDs 12 was illuminated only once per each one rotation. Accordingly, it is possible to obtain a higher value for the luminance of the light which is emitted, in the case of the light emitting apparatus 2 according to the first preferred embodiment of the present invention.

At the time, although the total area ($2 \times \phi \times d$) of the two incident end surfaces 60A in the light emitting apparatus 65 (not according to the present invention) shown in FIG. 26B is greater than the area (($1+\sqrt{3}/2) \times \phi \times d$) of the single incident surface 13B in the light emitting apparatus 2 according to the first preferred embodiment of the present invention shown in FIG. 26A, nevertheless, as shown in FIG. 25, along with the rotational shifting of the incident end surfaces 60A, the total area of the emission end surfaces 13B of the optical elements 13 of the light emitting device 66 of which the LEDs 12 are emitting light and which are opposing the incident end surfaces 60A varies between about three times and about four times the area of a single one of the emission end surfaces 13B.

Furthermore, if the tapered rod 60 is not sufficiently long, then, since the mixing effect within the tapered rod 60 is low, the prism meeting portion 68 is reflected upon the light emitting surface as a darkened portion, which is most undesirable.

Accordingly, with the light emitting apparatus 2 according to the first preferred embodiment of the present invention, the loss due to "Etendue" is smaller, since the area shape conversion efficiency of the incident end surface 7A, which is rectangular in form, with respect to the emission end surfaces 13B of the optical elements 13, which are of circular form, is higher. Furthermore, as shown by the broken line in FIG. 18, the amount of light variation is also lower with the light emitting apparatus 2 according to the first preferred embodiment of the present invention.

Yet further, with the present invention, it is possible to obtain the light satisfactorily although it is arranged for the light to be collected with only a single incident end surface, and moreover it is possible to emit light which has a more even distribution.

An arrangement would be acceptable in which, with the central position of the through hole 51C of the holder portion and the central position of its LED 12 being different, the focal point position of the reflection surface does not fall upon the axis C which passes through the approximately central position of the through hole 51C, as in the above described preferred embodiments, but rather, along with passing through the approximately central position of the LED 12, it is positioned upon an axis which is orthogonal to the first surface or to the second surface.

In the case, it is possible to emit light which has a higher degree of parallelism, due to the fact that the focal point position is caused to be matched to the central position of the LED 12.

Furthermore, if the approximately central position of the light emission portion 11 in the LED 12 and the central position of the LED 12 as a whole are different, then it will be acceptable to utilize a structure in which the focal point position of the reflection surface is positioned upon an axis which, along with passing through the approximately central position of the through hole, also is orthogonal with respect to the first surface or the second surface.

In the case, by matching the focal point position to the central position of the light emission portion 11, it is possible to emit parallel light having a higher directivity. Since, with the light emitting device according to the present invention, the light emitting elements and the optical elements which correspond to them are fixed in the holder portion which is provided with the through holes, accordingly it is possible to assemble the optical elements and the light emitting elements in an easy and convenient manner.

According to the present invention, it is possible to assemble the light emitting elements and the optical elements which correspond to them in an easy and convenient manner, and thus it is possible to enhance the accuracy of attachment of the light emitting devices, and to improve the productivity of the manufacturing process.

Furthermore, due to the, it is possible to provide a light emitting apparatus, and an image projection apparatus, which, while being compact, nevertheless are endowed with the capability of providing high luminance light emitting which has good evenness, and which can be manufactured with high productivity.

Yet further, when propagating light from the light emitting devices, even though the emission end surfaces of the light emitting devices are formed as circular, whereas the incident end surface of the pillar shaped light propagating unit is formed as rectangular, nevertheless it is possible to reduce to the minimum level the loss due to "Etendue", which inevitably accompanies such a difference between the shapes of the emission end surfaces and the shape of the incident end surface.

Furthermore, in the light emitting device according to the present invention, the optical element includes a first convex portion which is formed so as to protrude so as to be able to be engaged in the through hole, the concave portion is formed in the first convex portion in the opposite direction to the direction in which the first convex portion protrudes, and the light emitting element includes a second convex portion which can be engaged with the concave portion.

With the light emitting device, it is possible to fix the first convex portion by engaging it into the through hole and fixing the optical element to the holder portion, and then it is possible to fix the light emitting element to the holder portion and to the optical element by inserting the second convex portion into the through hole and engaging it with the concave portion.

Furthermore, in the light emitting device according to the present invention, the through hole is shaped as circular in cross section, and the first convex portion is shaped as a circular cylinder.

With the light emitting device, since the through hole and the convex portion which are mutually engaged with one another are both formed in circular shapes, accordingly it is possible to obtain a high degree of manufacturability for both of them, and high accuracy of fitting direction and positioning can easily be obtained.

Furthermore, in the light emitting device according to the present invention, a gap portion is disposed at a portion of the through hole, in which, when the first convex portion is inserted therein, the contact with the first convex portion is avoided.

With the light emitting device, if adhesive is used when fixing the optical element to the holder portion, it is possible for excessive adhesive to be accumulated and to remain in the gap portion, so that it is possible to perform the work of adhesion in an easy and convenient manner.

Furthermore, in the light emitting device according to the present invention, a portion of the optical element is formed with a protruding portion which is formed to protrude, so as to be able to engage with the through hole, the concave portion is formed upon the protruding portion in the opposite direction to the direction in which the protruding portion protrudes, a plurality of reception portions which open to one side surface are provided upon the holder portion in the vicinity of the through hole, a plurality of holding portions are provided upon the side surface of the protruding portion so as to stand up toward the direction in which the protruding portion protrudes, each of which can be inserted into one of the plurality of reception portions, and the light emitting element includes a second convex portion which can engage with the concave portion.

With the light emitting device, when fixing the optical element to the holder portion, along with engaging the protruding portion into the through hole, by inserting each of the holding portions into its corresponding reception portion, it is possible to assemble the optical element in a more appropriate and accurate position.

Furthermore, in the light emitting device according to the present invention, the optical element includes a first surface which can contact the light emitting element, and which extends approximately parallel to other side surface of the holder portion, the light emitting element includes a second surface which can contact the first surface, and which extends approximately parallel to the other side surface of the holder portion, and the contact position of the first surface and the second surface is positioned as removed from the interior of the through hole.

With the light emitting device, it is possible to fix the optical element and the light emitting element to the holder portion while in the state in which the first surface and the second surface are in mutual contact.

Since, at the time, the contact position is not within the through hole, accordingly it is possible to perform the fixing while checking the state of contact, and thus it is possible to obtain the correct position in an easy and convenient manner.

Furthermore, in the light emitting device according to the present invention, the first surface and the second surface are positioned at approximately the same position as the other side surface of the holder portion.

With the light emitting device, it is possible to contact together the first surface and the second surface while taking the other side surface of the holder portion as a standard, so that it is possible to enhance the accuracy of determination of their positions.

Furthermore, in the light emitting device according to the present invention, an engagement surface for a removal tool which is used when forming the optical element is provided in the first surface.

With the light emitting device, when manufacturing the optical element, by arranging for the removal tool to engage against the engagement surface of the first surface, it is possible to perform the removal of the optical element from the mold in a convenient and easy manner.

Furthermore, in the light emitting device according to the present invention, the optical element includes a reflection surface which is shaped as a paraboloid of revolution, which converts the diffused light which is incident from the concave portion into approximately parallel light, and the focal point position of the reflection surface passes through the approximate center line of the through hole, and is positioned upon an axis which is orthogonal to the first surface or the second surface.

With the light emitting device, by positioning the focal point position of the parabolic surface in the position as described above, it is possible to enhance the manufacturability of the device, since the manufacturing process for the mold becomes easier because no complicated shape such as one which is tilted or the like is required.

Furthermore, it is possible to ensure that the direction of the approximately parallel light is the direction of the above described axis, and it is possible to obtain the desired and appropriate optical characteristics, when fitting it to the holder portion.

Furthermore, in the light emitting device according to the present invention, the optical element includes a reflection surface which is shaped as a paraboloid of revolution, which converts the diffused light which is incident from the concave portion into approximately parallel light, and the focal point position of the reflection surface passes through the approximate center line of the light emitting element, and is positioned upon an axis which is orthogonal to the first surface or the second surface.

With the light emitting device, since the reflection surface of the optical element is formed with respect to the central axis of the light emitting element, accordingly it is possible to emit light with a higher degree of parallelism.

Furthermore, in the light emitting device according to the present invention, the approximately central position of the light emission portion passes through the approximate center line of the through hole, and is positioned upon an axis which is orthogonal to the first surface or the second surface.

With the light emitting device, even if the light emission portion is not upon the central position of the entire light emitting element, it is possible to emit light with a high degree of parallelism, by forming the optical element while taking the light emission portion as a standard.

Furthermore, in the light emitting device according to the present invention, the optical element and the holder portion are fixed in the through hole with adhesive.

With the light emitting device, it is possible to fix the optical element to the holder portion, and to maintain it there, in an easy and convenient manner.

Furthermore, in the light emitting device according to the present invention, there is further included a pressure member which presses the light emitting element towards the holder portion on the other side surface, and the light emitting element may be fixed to the holder portion by being pressed by the pressure member.

With the light emitting device, it is possible to remove the light emitting element or the optical element from the holder portion in a very easy manner, by canceling the pressure of the pressure member when changing the light emitting element or the optical element.

Furthermore, in the light emitting device according to the present invention, a heat radiation section which radiates away heat which is generated by the light emitting element is provided to the pressure member.

With the light emitting device, when high luminance is required, it is possible to ensure that the head which is generated by the light emitting elements is radiated away by the heat radiation section, so that, while maintaining thermal stability, it is nevertheless possible to obtain light of high luminance.

Furthermore, in the light emitting device according to the present invention, a plurality of through holes are provided in the holder portion, and a plurality of optical elements and a plurality of light emitting elements are provided.

With the light emitting device, it is possible to obtain light of higher luminance by providing a plurality of light emitting elements in their corresponding through holes. Furthermore, in the light emitting device according to the present invention, the holder portion is formed in a tubular shape, with the one side surface being defined upon its inner circumferential surface, and the other side surface being defined upon its outer circumferential surface.

With the light emitting device, it is possible to gather together the light which has been emitted from the light emitting elements at high accuracy, since it is directed towards a fixed internal region in the direction of the center of the holder portion.

Furthermore, in the light emitting device according to the present invention, at least one side surface of the holder portion is formed as a cylindrical surface.

With the light emitting device, it is possible to produce the central position of the holder portion more easily, and it is possible to gather together the light which has been emitted from the light emitting elements in a more appropriate manner, since it is directed towards a fixed internal region in a central position.

According to the present invention, there is proposed a light emitting apparatus, including a light emitting device as first described above, a pillar shaped light propagating unit which has an incident end surface which receives intake of a portion of the radiant light which has been emitted from the light emitting device, an emission end surface which emits the radiant light which has been taken in from the incident end surface, and a reflection surface which reflects at least a portion of the radiant light which has been taken in from the incident end surface, and leads the radiant light thereto to the emission end surface, a shift unit which shifts a portion of the pillar shaped light propagating unit with respect to the light emitting device, and a light emission control unit which controls light emission by the plurality of light emitting elements along with the shifting of the pillar shaped light propagating unit.

Since, with the light emitting apparatus, there is incorporated a light emitting device according to the present invention, accordingly it is possible to obtain light of high luminance and with an even light emitting distribution from the pillar shaped light propagating unit, even though a diffused light source is employed.

Furthermore, in the light emitting apparatus according to the present invention, only one of the pillar shaped light propagating unit is provided, and, along with the shifting of the pillar shaped light propagating unit, the light emission control unit makes the plurality of light emitting elements facing to the one incident end surface emit in order.

Since, with the light emitting apparatus, light is emitted from the plurality of light emitting elements towards the single incident end surface, accordingly it is possible to emit light from the emission end surface by gathering in the light from at least one among all of the light emitting elements into the pillar shaped light propagating unit.

Furthermore, in the light emitting apparatus according to the present invention, the plurality of through holes are arranged on a circumference of which center is arranged on the central axis of the holder portion, and the plurality of rows of through holes are arranged along the central axial line direction.

With the light emitting apparatus, it is possible to gather in the light from the light emitting devices into the pillar shaped light propagating unit by shifting the incident end surface in the circumferential direction with respect to the rows of through holes.

Furthermore, in the light emitting apparatus according to the present invention, the through holes are arranged so that the emission sides of the light emitting device can be arranged while being adjacent to zigzag configuration.

With the light emitting apparatus, it is possible to arrange the light emitting devices in the through holes of the holder portion at the maximum possible density, and accordingly it is possible to propagate the light into the pillar shaped light propagating unit at a high efficiency, even though the area of its incident end surface is relatively small.

Accordingly, since it is possible appropriately to suppress loss of area due to differences in the shape of the incident end surface of the pillar shaped light propagating unit, with respect to the total area of the emission end surfaces of the light emitting devices which confront the pillar shaped light propagating unit at all times, therefore it is possible to reduce the losses due to "Etendue", so that it is possible to obtain light at high efficiency.

Furthermore, in the light emitting apparatus according to the present invention, the one incident end surface of the pillar shaped light propagating unit is formed as a rectangle which is defined and surrounded by a first pair of sides which are approximately parallel to the central axis of the holder portion, and a second pair of sides which are each orthogonal to the first pair of sides, and the second pair of sides are disposed at a distance of approximately contacting with an outer edge in the central axial direction according to the optical element of the light emitting device arranged to the row of each through hole.

With the light emitting apparatus, it is possible to capture the light from the emission end surfaces of those ones of the optical elements of the light emitting device which are arranged in a zigzag pattern in their through holes which are included the rows of through holes in the holder portion, and which are currently confronting the incident end surface of the pillar shaped light propagating unit, without any excess or deficiency, so that it is possible to suppress loss of capturing efficiency, and to obtain light at high efficiency.

Furthermore, in the light emitting apparatus according to the present invention, when the diameter of the emission end surface of the optical element is termed $\phi$, the number of the rows of through holes is termed n, and the distance between the second pair of sides is termed L, the relationship $\phi+(n-1)\times(\sqrt{3}/2)\times\phi \square L<n\times\phi$ is satisfied.

With the light emitting apparatus, since the length of the first pair of sides of the incident end surface satisfies the above described relationship, accordingly, when the light emitting devices are arranged in a zigzag pattern, on the one hand it is possible to capture the light efficiently by making the area of the incident end surface be greater than the total area of the emission end surfaces of the plurality of optical elements which confront that incident end surface at all times, and moreover it is possible to suppress the region in which no light is captured to the minimum possible limit.

Furthermore, in the light emitting apparatus according to the present invention, the pillar shaped light propagating unit includes one parallel rod upon which the incident end surface is provided, one prism which, along with being connected to the parallel rod, changes the direction of the light from the parallel rod with the reflection surface, and one tapered rod which, along with being separated from the prism, receives the light which has been bent by the prism, and directs the light to the emission end surface while reflecting the light thereof with the reflection surface.

With the light emitting apparatus, it is possible to supply the light which is emitted from the emission end surface of the pillar shaped light propagating unit entirely with the light which is incident upon the single end surface, so that it is possible to emit light at high efficiency, and moreover with a more even distribution of luminance.

According to the present invention, there is proposed an image projection apparatus which projects an image based upon image information which is inputted, having a light emitting apparatus of the type first described above, a spatial modulation unit which modulates light which is emitted from the emission end surface of the pillar shaped light propagating unit, based upon image information which has been inputted, and a projection optical unit which projects the light emitting light which has been modulated by the spatial modulation unit.

Since, with the image projection apparatus, a light emitting apparatus according to the present invention is incorporated, accordingly it is possible to display a bright projected image of high quality, and which has an even light emitting distribution, even though a diffused light source is employed.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A light emitting device comprising:
   at least one light emitting element which has a light emission portion which emits diffused light;
   at least one optical element upon which a concave portion is formed in which the diffused light which has been emitted from the light emitting element is incident, and which optical element converts the diffused light into approximately parallel light and emits the approximately parallel light thereof to an exterior of the optical element; and
   a holder portion which has one side surface, an opposite side surface, and at least one through hole which extends between the one and the opposite side surfaces, for holding the light emitting element and the optical element, the through hole being circular in cross section;
   wherein the optical element is inserted into said at least one through hole from a side of the one side surface of the holder portion, and is fixed therein, and the light emitting element is inserted into the through hole to which the optical element is fixed from a side of the opposite side surface of the holder portion, and is fixed therein; and
   wherein the optical element has a first convex portion which is formed to protrude from one end of the optical element for engaging the through hole, the first convex portion being a circular cylinder, the concave portion being formed in the first convex portion in the opposite direction to the direction in which the first convex portion protrudes, and the light emitting element has a second convex portion which engages the concave portion.

2. A light emitting device comprising:
   at least one light emitting element which has a light emission portion which emits diffused light;
   at least one optical element upon which a concave portion is formed in which the diffused light which has been emitted from the light emitting element is incident, and which optical element converts the diffused light into approximately parallel light and emits the approximately parallel light thereof to an exterior of the optical element; and
   a holder portion which has one side surface, an opposite side surface, and at least one through hole which extends between the one side surface and the opposite side surface, for holding the light emitting element and the optical element;
   wherein the optical element is inserted into said at least one through hole from a side of the one side surface of the holder portion, and is fixed therein, and the light emitting element is inserted into the through hole to which the optical element is fixed from a side of the opposite side surface of the holder portion, and is fixed therein; and
   wherein a portion of the optical element is formed with a protruding portion for engaging the through hole, the concave portion being formed upon the protruding portion in a direction opposite a direction in which the protruding portion protrudes, a plurality of reception portions which open to one side surface being provided in the holder portion in the vicinity of the through hole, a plurality of holding portions being provided upon the side surface of the protruding portion and extending in a direction in which the protruding portion protrudes, each of the holding portions being inserted into one of the plurality of reception portions, and the light emitting element being provided with a second convex portion which engages the concave portion.

3. A light emitting device comprising:
   at least one light emitting element which has a light emission portion which emits diffused light;
   at least one optical element upon which a concave portion is formed in which the diffused light which has been emitted from the light emitting element is incident, and which optical element converts the diffused light into approximately parallel light and emits the approximately parallel light thereof to an exterior of the optical element; and
   a holder portion which has one side surface, an opposite side surface, and at least one through hole which extends between the one side surface and the opposite side surface, for holding the light emitting element and the optical element;
   wherein the optical element is inserted into said at least one through hole from a side of the one side surface of the holder portion, and is fixed therein, and the light emitting element is inserted into the through hole to which the optical element is fixed from a side of the opposite side surface of the holder portion, and is fixed therein; and
   wherein the optical element is provided with a first surface which contacts the light emitting element, and which extends approximately parallel to the opposite side surface of the holder portion, the light emitting element being provided with a second surface which contacts the first surface, and which extends approximately parallel to the opposite side surface of the holder portion, and the contact position of the first surface and the second surface are positioned as removed from the interior of the through hole.

4. A light emitting device according to claim 3, wherein the first surface and the second surface are positioned at approximately the same position as the opposite side surface of the holder portion.

5. A light emitting device according to claim 3, wherein an engagement surface configured for engagement by a removal tool, which is used when forming the optical element, is provided along the first surface.

6. A light emitting device according to claim 3, wherein the optical element is provided with a reflection surface which is shaped as a paraboloid of revolution, for deflecting diffused light which is incident upon the concave portion into approximately parallel light, and a focal point position of the reflection surface passes through an approximate center line of the through hole, and is positioned upon an axis which is orthogonal to one of the first surface and the second surface.

7. A light emitting device according to claim 3, wherein the optical element is provided with a reflection surface which is shaped as a paraboloid of revolution, for deflecting diffused light which is incident upon the concave portion into approximately parallel light, and a focal point position of the reflection surface passes through an approximate center line of the through hole, and is positioned upon an axis which is orthogonal to one of the first surface and the second surface.

8. A light emitting device according to claim 3, wherein an approximately central position of the light emission portion passes through an approximate center line of the through hole, and is positioned upon an axis which is orthogonal to one of the first surface and the second surface.

9. A light emitting device comprising:
at least one light emitting element which has a light emission portion which emits diffused light;
at least one optical element upon which a concave portion is formed in which the diffused light which has been emitted from the light emitting element is incident, and which optical element converts the diffused light into approximately parallel light and emits the approximately parallel light thereof to an exterior of the optical element;
a holder portion which has one side surface, an opposite side surface, and at least one through hole which extends between the one side surface and the opposite side surface, for holding the light emitting element and the optical element; and
a pressure member which presses the light emitting element against the holder portion on the opposite side surface;
wherein the optical element is inserted into said at least one through hole from a side of the one side surface of the holder portion, and is fixed therein, and the light emitting element is inserted into the through hole to which the optical element is fixed from a side of the opposite side surface of the holder portion, and is fixed therein; and
wherein the light emitting element is maintained in position relative to the holder portion by being pressed by the pressure member, and a heat radiation section which radiates away heat generated by the light emitting element is provided along the pressure member.

10. A light emitting device comprising:
at least one light emitting element which has a light emission portion which emits diffused light;
at least one optical element upon which a concave portion is formed in which the diffused light which has been emitted from the light emitting element is incident, and which optical element converts the diffused light into approximately parallel light and emits the approximately parallel light thereof to an exterior of the optical element; and
a holder portion which has one side surface, an opposite side surface, and at least one through hole which extends between the one side surface and the opposite side surface, for holding the light emitting element and the optical element;
wherein the optical element is inserted into said at least one through hole from a side of the one side surface of the holder portion, and is fixed therein, and the light emitting element is inserted into the through hole to which the optical element is fixed from a side of the opposite side surface of the holder portion, and is fixed therein; and
wherein a plurality of through holes are provided in the holder portion, and a plurality of optical elements and a plurality of light emitting elements are provided for each through hole, and the holder portion is formed in an annular shape, with the one side surface being defined upon an inner circumferential surface thereof, and the opposite side surface being defined upon an outer circumferential surface thereof.

11. A light emitting device according to claim 10, wherein at least one side surface of the holder portion is formed as a cylindrical surface.

12. A light emitting apparatus, comprising:
a light emitting device according to claim 11;
at least one pillar shaped light propagating unit which has an incident end surface which receives a portion of the radiant light emitted from the light emitting device, an emission end surface which emits radiant light taken in from the incident end surface, and a reflection surface which reflects at least a portion of the radiant light entering the incident end surface, and leads the radiant light thereof to the emission end surface;
a shift unit which shifts a portion of the pillar shaped light propagating unit with respect to the light emitting device; and
a light emission control unit which controls light emission by the plurality of light emitting elements along with the shifting of the pillar shaped light propagating unit.

13. A light emitting apparatus according to claim 12, wherein only one pillar shaped light propagating unit is provided, and, along with shifting the pillar shaped light propagating unit, the light emission control unit controls the plurality of light emitting elements facing the one incident end surface to emit light in a given order.

14. A light emitting apparatus according to claim 13, wherein the plurality of through holes are arranged in a plurality of rows, each row of through holes being located about a circumference of which said holder portion circumference has a center arranged on a central axis of the holder portion, the plurality of rows of through holes extending in the direction of the central axis.

15. A light emitting apparatus according to claim 14, wherein the through holes of adjacent rows are arranged so that the emission sides of the light emitting devices in said through holes are arranged in a zigzag fashion.

16. A light emitting apparatus according to claim 15, wherein the one incident end surface of the pillar shaped light propagating unit is formed as a rectangle which is defined and surrounded by a first pair of sides which are approximately parallel to the central axis of the holder portion, and a second pair of sides which are each orthogonal to the first pair of sides, and the second pair of sides are spaced apart by a distance so that said second pair of sides substantially coincides with outer edges of optical elements in the central axial direction according to the optical element of the light emitting device arranged in the row of each through hole.

17. A light emitting apparatus according to claim 16, wherein, when $\phi$ represents a diameter of the emission end surface of the optical element, n represents a number of the rows of through holes, and the L represents a distance between the second pair of sides, the relationship $\phi+(n-1)\times(\sqrt{3}/2)\times\phi<L<n\times\phi$ is satisfied.

18. A light emitting apparatus according to claim 13, wherein the pillar shaped light propagating unit is provided with a parallel rod upon which the incident end surface is provided, a prism which, along with being connected to the parallel rod, changes a direction of light from the parallel rod with a reflection surface, and one tapered rod which, along with being separated from the prism, receives light which has been bent by the prism, and directs the light to the emission end surface while reflecting the light thereof with a reflection surface.

19. An image projection apparatus which projects an image based upon image information which is inputted, comprising:
a light emitting apparatus according to claim 12;
a spatial modulation unit which modulates light which is emitted from the emission end surface of the pillar shaped light propagating unit, based upon image information which has been inputted; and
a projection optical unit which projects the light emitting light which has been modulated by the spatial modulation unit.

20. A light emitting apparatus according to claim 15, wherein there two rows of light emitting devices, each having a circular-shape of a given diameter and wherein the incident end surface of the pillar shaped light propagating unit is a square-shaped area of a given size so that a length of each side of said area is substantially equal to two-times said given diameter.

21. A light emitting apparatus according to claim 20 wherein the incident end of said pillar shaped light propagating unit is positioned relative to said two rows of light emitting devices so that, at any given time, a total area of said light emitting devices aligned with said incident end surface is substantially four times a surface area of one of said light emitting devices.

22. A light emitting apparatus according to claim 15, wherein there are n rows of light emitting devices having a circular shape of a given diameter, and
wherein the incident end surface of said pillar shaped light propagating unit is substantially square-shaped and wherein each side of said square-shaped area is approximately equal to $n^2$ times a diameter of said light emitting devices.

23. A light emitting apparatus according to claim 22 wherein the incident end of said pillar shaped light propagating unit is positioned so that at any given time, a total area of said light emitting devices aligned with said incident end surface is substantially eight and one-half times a surface area of one of said light emitting devices.

24. A light emitting apparatus according to claim 15, wherein there are n rows of light emitting devices, each having a circular-shape of a given diameter and wherein the incident end surface of the pillar shaped light propagating unit is positioned relative to the n rows of said light emitting devices so that at any given time, a total area of said light emitting devices aligned with said incident end surface is substantially two and one-half times a surface area of one of said light emitting devices.

25. A light emitting device comprising:
at least one light emitting element which has a light emission portion which emits diffused light, said light emitting element having a dome shaped lens;
at least one optical element upon which a concave portion is formed in which the diffused light which has been emitted from the light emitting element is incident, and which optical element converts the diffused light into approximately parallel light and emits the approximately parallel light thereof to an exterior of the optical element; and
a holder portion which has one side surface, an opposite side surface, and at least one through hole which extends between the one side surface and the opposite side surface, for holding the light emitting element and the optical element;
wherein the optical element is inserted into said at least one through hole from a side of the one side surface of the holder portion, and is fixed therein, and the light emitting element is inserted into the through hole to which the optical element is fixed from a side of the opposite side surface of the holder portion, and is fixed therein; and
wherein said optical element comprises:
a circular shaped input end configured for insertion into said through hole;
a central opening extending into said optical element from said circular shaped input end, said opening having a cylindrical shaped interior surface for refracting light impinging thereon;
said central opening terminating in an interior convex surface adjacent to and aligned with a convex exterior surface of said dome-shaped lens;
an exterior convex curved periphery of said optical element tapering outwardly from said circular shaped input end to an output end, surrounding said opening and configured to reflect light refracted at said cylindrical shaped interior periphery to be emitted from an output end of said optical element so as to pass through an annular shaped region surrounding a central region of said output end and aligned substantially parallel to a central axis of said optical element, and
a fresnel lens in said central region of said output end whereby light directed to said interior convex surface from said light emitting device is refracted by said optical element at said interior convex surface and said fresnel lens so as to be parallel to said central axis when exiting from said optical element output end.

26. A light emitting device comprising:
- at least one light emitting element which has a light emission portion which emits diffused light, said light emitting element having a dome shaped lens;
- at least one optical element upon which a concave portion is formed in which the diffused light which has been emitted from the light emitting element is incident, and which optical element converts the diffused light into approximately parallel light and emits the approximately parallel light thereof to an exterior of the optical element; and
- a holder portion which has one side surface, an opposite side surface, and at least one through hole which extends between the one side surface and the opposite side surface, for holding the light emitting element and the optical element;
- wherein the optical element is inserted into said at least one through hole from a side of the one side surface of the holder portion, and is fixed therein, and the light emitting element is inserted into the through hole to which the optical element is fixed from a side of the opposite side surface of the holder portion, and is fixed therein; and
- wherein said optical element comprises:
  - a circular shaped end configured for insertion into said through hole;
  - a central opening extending into said optical element from said circular shaped end, said opening having a cylindrical shaped interior surface for refracting light impinging thereon;
  - said central opening terminating an interior convex surface adjacent to and aligned with a convex exterior surface of said dome-shaped lens;
  - an exterior curved periphery tapering outwardly from said circular shaped input end to an output end, surrounding said opening and configured to reflect light entering said cylindrical-shaped interior periphery to be emitted from an output end of said optical element so as to pass through an annular region surrounding a central region of said output end and parallel to a central axis of said optical element, and
  - said output end having a curved convex exterior surface in said central region of said output end whereby light directed to said interior convex surface from said light emitting device is refracted at said interior convex surface and said curved convex exterior surface so as to be parallel to said central axis when exiting from said optical element output end.

27. A light emitting device comprising:
- at least one light emitting element which has a light emission portion which emits diffused light, said light emitting element having a dome shaped lens;
- at least one optical element upon which a concave portion is formed in which the diffused light which has been emitted from the light emitting element is incident, and which optical element converts the diffused light into approximately parallel light and emits the approximately parallel light thereof to an exterior of the optical element; and
- a holder portion which has one side surface, an opposite side surface, and at least one through hole which extends between the one side surface and the opposite side surface, for holding the light emitting element and the optical element;
- wherein the optical element is inserted into said at least one through hole from a side of the one side surface of the holder portion, and is fixed therein, and the light emitting element is inserted into the through hole to which the optical element is fixed from a side of the opposite side surface of the holder portion, and is fixed therein; and
- wherein said optical element comprises:
  - a circular shaped input end configured for insertion into said through hole;
  - a central opening extending into said optical element from said circular shaped input end, said opening having a cylindrical shaped interior surface for refracting light impinging thereon;
  - said opening terminating in a fresnel lens surface adjacent to a convex exterior surface of said dome-shaped lens;
  - an exterior curved periphery tapering outwardly from said circular shaped input end to an output end, surrounding said opening and configured to reflect light entering said cylindrical-shaped interior periphery to be emitted from an output end of said optical element so as to pass through an annular region surrounding a central region of said output end and parallel to a central axis of said optical element, and
  - a curved convex exterior surface in said central region of said output end whereby light directed to said fresnel lens surface from said light emitting device is refracted at said fresnel lens surface and said curved convex exterior surface so as to be parallel to said central axis when exiting from said optical element output end.

* * * * *